US012609683B2

(12) United States Patent
Choi

(10) Patent No.: US 12,609,683 B2
(45) Date of Patent: Apr. 21, 2026

(54) RECEIVER CIRCUIT, AND SEMICONDUCTOR APPARATUS AND SEMICONDUCTOR SYSTEM USING THE SAME

(71) Applicant: SK hynix Inc., Icheon-si (KR)

(72) Inventor: Sung Phil Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 6 days.

(21) Appl. No.: 18/805,262

(22) Filed: Aug. 14, 2024

(65) Prior Publication Data

US 2025/0317131 A1 Oct. 9, 2025

(51) Int. Cl.
*H03K 5/01* (2006.01)
*H03K 3/037* (2006.01)
*H03K 5/00* (2006.01)

(52) U.S. Cl.
CPC .............. *H03K 5/01* (2013.01); *H03K 3/037* (2013.01); *H03K 2005/00019* (2013.01)

(58) Field of Classification Search
CPC . H03K 5/01; H03K 3/037; H03K 2005/00019
USPC ........................................................ 327/199
See application file for complete search history.

(56) References Cited

U.S. PATENT DOCUMENTS

| | | | | |
|---|---|---|---|---|
| 6,346,830 | B1 * | 2/2002 | Ishikawa .............. | G11C 7/1051 |
| | | | | 327/156 |
| 7,123,046 | B2 * | 10/2006 | Keeth .................. | G11C 7/1078 |
| | | | | 326/26 |
| 10,997,095 | B2 * | 5/2021 | Mayer ................. | G06F 11/1004 |
| 11,500,794 | B2 * | 11/2022 | Mayer ................. | G06F 13/4072 |
| 11,815,551 | B1 * | 11/2023 | Fayneh ........... | G01R 31/31726 |
| 2013/0195155 | A1 * | 8/2013 | Pan .......................... | H03D 1/00 |
| | | | | 375/317 |
| 2020/0274741 | A1 * | 8/2020 | Kang .................. | H04L 25/0296 |
| 2024/0038602 | A1 * | 2/2024 | Fayneh ................. | H01L 22/34 |
| 2024/0427461 | A1 * | 12/2024 | Koike .................. | G06F 3/0442 |
| 2025/0119138 | A1 * | 4/2025 | Park ........................ | H03K 3/037 |
| 2025/0219604 | A1 * | 7/2025 | Choi .................. | H03F 3/45183 |
| 2025/0317131 | A1 * | 10/2025 | Choi .................... | H03K 3/037 |

* cited by examiner

*Primary Examiner* — Ryan Jager
(74) *Attorney, Agent, or Firm* — WILLIAM PARK AND ASSOCIATES LTD.

(57) ABSTRACT

A receiver circuit is configured to generate, based on a clock signal, a first output signal by differentially amplifying an input signal and a reference voltage and to generate, based on a complementary clock signal, a second output signal by differentially amplifying the input signal and the reference voltage. The receiver circuit is configured to generate a first delay output signal and a second delay output signal by delaying the first output signal and the second output signal. The receiver circuit is configured to variably delay the first output signal based on the first output signal and the reference voltage and to variably delay the second output signal based on the second output signal and the reference voltage.

24 Claims, 10 Drawing Sheets

RECEIVER CIRCUIT, AND SEMICONDUCTOR APPARATUS AND SEMICONDUCTOR SYSTEM USING THE SAME

CROSS-REFERENCES TO RELATED APPLICATION

The present application claims priority under 35 U.S.C. § 119(a) to Korean patent application number 10-2024-0045273, filed on Apr. 3, 2024, in the Korean Intellectual Property Office, which application is incorporated herein by reference in its entirety.

BACKGROUND

1. Technical Field

The present disclosure relates to an integrated circuit technology, including but not limited to a receiver circuit, and a semiconductor apparatus and a semiconductor system including the receiver circuit.

2. Related Art

Electronic devices include many electronic components, and among the electronic devices, a computer system includes many semiconductor apparatuses made of semiconductors. The semiconductor apparatus constituting the computer system perform data communication in synchronization with a clock signal. A first semiconductor apparatus transmits data in synchronization with the clock signal, and a second semiconductor apparatus connected to the first semiconductor apparatus receives the data in synchronization with the clock signal.

To perform data communication at a high speed, semiconductor apparatus is connected through a serial bus. The semiconductor apparatus may serialize internal data and transmit the serialized data to another semiconductor apparatus through the serial bus. The semiconductor apparatus may parallelize data received from the other semiconductor apparatus through the serial bus and generate the parallelized data as internal data. The semiconductor apparatus may include a serializer-deserializer (SerDes) that serializes the internal data or parallelizes the received data. The data may be transmitted as a single-ended signal through the serial bus. Accordingly, the semiconductor apparatus may include a receiver circuit having a pseudo-differential structure that receives the data transmitted through the serial bus by comparing the data with a reference voltage.

SUMMARY

In an embodiment, a receiver circuit may include a first receiver, a second receiver, a first delay circuit, and a second delay circuit. The first receiver may be configured to generate, based on a clock signal, a first output signal by differentially amplifying an input signal and a reference voltage. The second receiver may be configured to generate, based on a complementary clock signal, a second output signal by differentially amplifying the input signal and the reference voltage. The first delay circuit may be configured to generate a first delay output signal by variably delaying the first output signal based on a voltage information signal and the first output signal. The second delay circuit may be configured to generate a second delay output signal by variably delaying the second output signal based on the voltage information signal and the second output signal.

In an embodiment, a receiver circuit may include a first receiver, a second receiver, a first delay circuit, and a second delay circuit. The first receiver may be configured to generate, based on a clock signal, a first output signal by differentially amplifying an input signal and a reference voltage. The second receiver may be configured to generate, based on a complementary clock signal, a second output signal by differentially amplifying the input signal and the reference voltage. The first delay circuit may be configured to generate a first delay output signal by variably delaying the first output signal based on a difference between a voltage level of the first output signal and a voltage level of the reference voltage. The second delay circuit may be configured to generate a second delay output signal by variably delaying the second output signal based on a difference between a voltage level of the second output signal and the voltage level of the reference voltage.

In an embodiment, a receiver circuit may include a first receiver, a second receiver, a third receiver, a fourth receiver, a first delay circuit, a second delay circuit, a third delay circuit, and a fourth delay circuit. The first receiver may be configured to generate, in synchronization with a first clock signal, a first output signal by differentially amplifying an input signal and a reference voltage. The second receiver may be configured to generate, in synchronization with a second clock signal, a second output signal by differentially amplifying the input signal and the reference voltage. The third receiver may be configured to generate, in synchronization with a third clock signal, a third output signal by differentially amplifying the input signal and the reference voltage. The fourth receiver may be configured to generate, in synchronization with a fourth clock signal, a fourth output signal by differentially amplifying the input signal and the reference voltage. The first delay circuit may be configured to generate a first delay output signal by variably delaying the first output signal based on a difference between a voltage level of the first output signal and a voltage level of the reference voltage. The second delay circuit may be configured to generate a second delay output signal by variably delaying the second output signal based on a difference between a voltage level of the second output signal and the voltage level of the reference voltage. The third delay circuit may be configured to generate a third delay output signal by variably delaying the third output signal based on a difference between a voltage level of the third output signal and the voltage level of the reference voltage. The fourth delay circuit may be configured to generate a fourth delay output signal by variably delaying the fourth output signal based on a difference between a voltage level of the fourth output signal and the voltage level of the reference voltage.

In an embodiment, a method may include, based on a first clock signal, differentially amplifying an input signal and a reference voltage in a first receiver to generate a first output signal; based on a second clock signal, differentially amplifying the input signal and the reference voltage in a second receiver to generate a second output signal; delaying the first output signal by a first delay period based on a voltage information signal and the first output signal to generate a first delay output signal; delaying the second output signal by a second delay period based on the voltage information signal and the second output signal to generate a second delay output signal; and in synchronization with a third clock signal, outputting a first alignment output signal generated from the first delay output signal and a second alignment output signal generated from the second delay output signal.

BRIEF DESCRIPTION OF THE DRAWINGS

FIG. 1 is a diagram illustrating a configuration of a receiver circuit in accordance with an embodiment.

DETAILED DESCRIPTION

Figure 2:
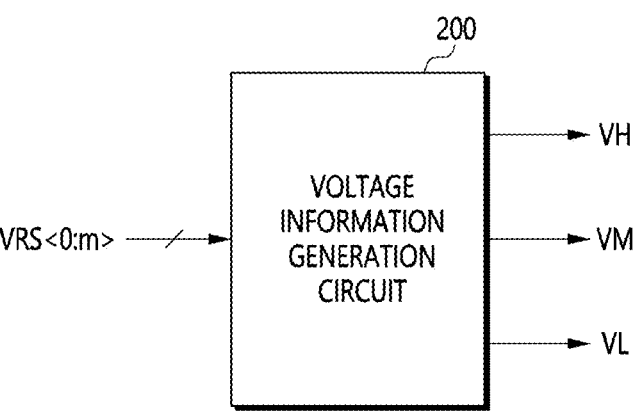
FIG. 2 is a block diagram illustrating a voltage information generation circuit in accordance with an embodiment.

When one element is identified as "connected" to another element, the elements may be connected directly or through an intervening element between the elements. When two elements are identified as "directly connected," one element is directly connected to the other element without an intervening element between the two elements.

Figure 1:
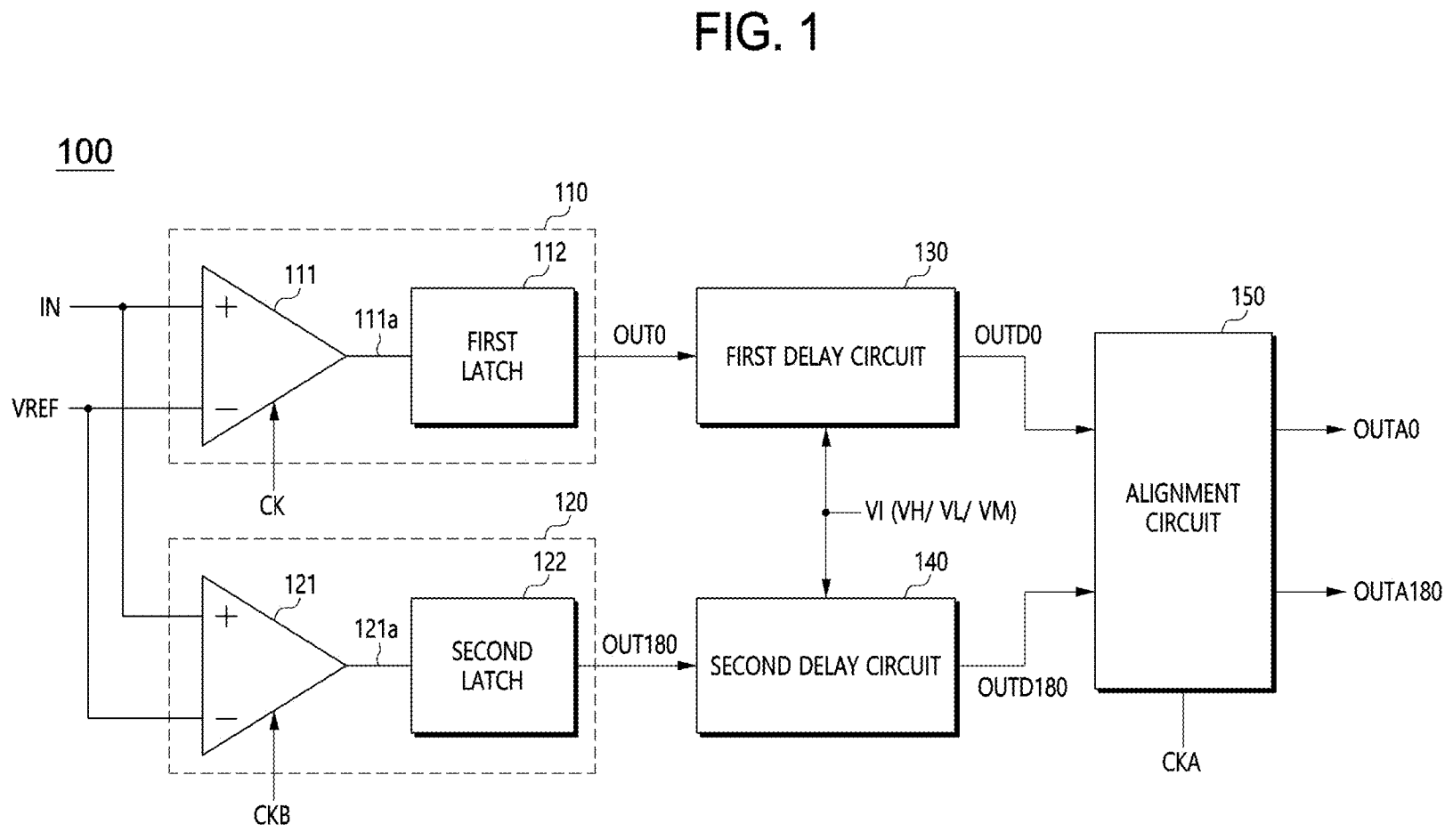

FIG. 1 is a diagram illustrating a configuration of a receiver circuit 100 in accordance with an embodiment. Referring to FIG. 1, the receiver circuit 100 receives an input signal IN and generates a plurality of output signals. The input signal IN may be a serial signal transmitted through a serial bus or a single-ended signal transmitted in synchronization with an arbitrary clock signal. The input signal IN may be a data signal. The receiver circuit 100 uses a reference voltage VREF to receive the input signal IN. The reference voltage VREF is at a voltage level corresponding to the middle or center of a range within which the input signal IN swings or a voltage level corresponding to the middle voltage level between a high or maximum voltage level and a low or minimum voltage level of the input signal IN. For example, the range of the input signal IN may vary between a low voltage level and a high voltage level, and the low voltage level may not be a minimum voltage level of the input signal IN, and the high voltage level may not be the maximum voltage level of the input signal IN. The receiver circuit 100 receives the reference voltage VREF and differentially amplifies the input signal IN and the reference voltage VREF. The receiver circuit 100 receives a clock signal CK. The receiver circuit 100 differentially amplifies the input signal IN and the reference voltage VREF based on the clock signal CK. The input signal IN may have a duration corresponding to a half cycle of the clock signal CK. The receiver circuit 100 generates a first output signal OUT0 and a second output signal OUT180 by differentially amplifying the input signal IN and the reference voltage VREF at each edge of the clock signal CK The receiver circuit 100 generates a first delay output signal OUTD0 and a second delay output signal OUTD180 by delaying the first output signal OUT0 and the second output signal OUT180, respectively. The receiver circuit 100 delays the first output signal OUT0 by a time period corresponding to one half cycle of the clock signal CK longer than the time period by which the second output signal OUT180 is delayed. The receiver circuit 100 generates the first delay output signal OUTD0 by additionally variably delaying the first output signal OUT0 based on a difference between a voltage level of the first output signal OUT0 and the voltage level of the reference voltage VREF. The receiver circuit 100 generates the second delay output signal OUTD180 by variably delaying the second output signal OUT180 based on a difference between a voltage level of the second output signal OUT180 and the voltage level of the reference voltage VREF.

The receiver circuit 100 generates a first alignment output signal OUTA0 and a second alignment output signal OUTA180 from the first delay output signal OUTD0 and the second delay output signal OUTD180, respectively, based on an alignment clock signal CKA. The receiver circuit 100 generates the delay output signals OUTD0 and OUTD180 having substantially the same phase by variably delaying the output signals OUT0 and OUT180 according to the difference between the voltage levels of the first output signal OUT0 and the second output signal OUT180 and the voltage level of the reference voltage VREF. Accordingly, the receiver circuit 100 may improve a setup and hold margin for generating the alignment output signals OUTA0 and OUTA180 from the delay output signals OUTD0 and OUTD180.

The receiver circuit 100 includes a first receiver 110, a second receiver 120, a first delay circuit 130, a second delay circuit 140, and an alignment circuit 150. The first receiver 110 receives the input signal IN, the reference voltage VREF, and the clock signal CK. The first receiver 110 generates the first output signal OUT0 by differentially amplifying the input signal IN and the reference voltage VREF based on the clock signal CK. The first receiver 110 differentially amplifies the input signal IN and the reference voltage VREF in synchronization with the clock signal CK. For example, the first receiver 110 generates the first output signal OUT0 by differentially amplifying the input signal IN and the reference voltage VREF in synchronization with a rising edge of the clock signal CK. The first receiver 110 may change the voltage level of the first output signal OUT0 according to the logic level of the input signal IN whenever the rising edge of the clock signal CK occurs. The first receiver 110 includes a first comparator 111 and a first latch 112. The first comparator 111 generates an amplification signal 111a by comparing the voltage level of the input signal IN and the voltage level of the reference voltage VREF in synchronization with the clock signal CK. The first comparator 111 includes a differential amplifier in this example. The first latch 112 latches the voltage level of the amplification signal 111a output from the first comparator 111 and outputs the latched signal as the first output signal OUT0. The phase of the first output signal OUT0 is synchronized with the rising edge of the clock signal CK.

The second receiver 120 receives the input signal IN, the reference voltage VREF, and a complementary clock signal CKB. The phase of the complementary clock signal CKB is opposite to the phase of the clock signal CK and a difference of 180° from the phase of the clock signal CK. For example, the complementary clock signal CKB may be a logically inverted version of the clock signal CK. The second receiver 120 generates the second output signal OUT180 by differentially amplifying the input signal IN and the reference voltage VREF based on the complementary clock signal CKB. The second receiver 120 differentially amplifies the input signal IN and the reference voltage VREF in synchronization with the complementary clock signal CKB. For example, the second receiver 120 generates the second output signal OUT180 by differentially amplifying the input signal IN and the reference voltage VREF in synchronization with a rising edge of the complementary clock signal CKB. The second receiver 120 may change the voltage level of the second output signal OUT180 according to the logic level of the input signal IN whenever the rising edge of the complementary clock signal CKB occurs. The second receiver 120 includes a second comparator 121 and a second latch 122. The second comparator 121 may generate an amplification signal 121a by comparing the voltage level of the input signal IN and the voltage level of the reference voltage VREF in synchronization with the complementary clock signal CKB. The second comparator 121 includes a differential amplifier in this example. The second latch 122 latches the voltage level of the amplification signal 121a output from the second comparator 121 and outputs the latched signal as the second output signal OUT180. The second output signal OUT180 has a phase synchronized with the complementary clock signal CKB.

The first delay circuit 130 receives the first output signal OUT0 and a voltage information signal VI. The first delay circuit 130 generates a first delay output signal OUTD0 by variably delaying the first output signal OUT0 based on the first output signal OUT0 and the voltage information signal VI. The first delay circuit 130 delays the first output signal OUT0 by a time period corresponding to a phase difference between the clock signal CK and the complementary clock signal CKB. The first delay circuit 130 generates the first delay output signal OUTD0 by additionally variably delaying the first output signal OUT0 based on the first output signal OUT0 and the voltage information signal VI. The voltage information signal VI is a signal including information identifying whether the voltage level of the reference voltage VREF is high or low. The voltage information signal VI includes at least a high voltage signal VH and a low voltage signal VL. When the voltage level of the reference voltage VREF is relatively high, the high voltage signal VH is asserted. When the voltage level of the reference voltage VREF is relatively low, the low voltage signal VL is asserted. In an embodiment, the voltage information signal VI may further include a middle voltage signal VM. When the voltage level of the reference voltage VREF falls within a highest voltage level range, the high voltage signal VH is asserted. When the voltage level of the reference voltage VREF falls within a middle voltage level range, the middle voltage signal VM is asserted. When the voltage level of the reference voltage VREF falls within a low voltage level range, the low voltage signal VL is asserted. Additional details regarding the voltage information signal VI are described, for example, with reference to FIG. 11. The first delay circuit 130 may increase a delay time period of the first output signal OUT0 as the difference between the voltage level of the first output signal OUT0 and the voltage level of the reference voltage VREF increases. The first delay circuit 130 may decrease the delay time period of the first output signal OUT0 as the difference between the voltage level of the first output signal OUT0 and the voltage level of the reference voltage VREF decreases.

The second delay circuit 140 receives the second output signal OUT180 and the voltage information signal VI. The second delay circuit 140 generates a second delay output signal OUTD180 by variably delaying the second output signal OUT180 based on the second output signal OUT180 and the voltage information signal VI. The second delay circuit 140 may increase a delay time period of the second output signal OUT180 as the difference between the voltage levels of the second output signal OUT180 and the reference voltage VREF increases. The second delay circuit 140 may decrease the delay time period of the second output signal OUT180 as the difference between the voltage level of the second output signal OUT180 and the voltage level of the reference voltage VREF decreases.

The alignment circuit 150 receives the first delay output signal OUTD0 from the first delay circuit 130 and receives the second delay output signal OUTD180 from the second delay circuit 140. The alignment circuit 150 receives the alignment clock signal CKA. The phase of the alignment clock signal CKA may be different from the phase of the clock signal CK and the phase of the complementary clock signal CKB and may be substantially the same phase as the phase of one of the clock signal CK and the complementary clock signal CKB. The alignment circuit 150 generates the alignment output signals OUTA0 and OUTA180 from the delay output signals OUTD0 and OUTD180, respectively, based on the alignment clock signal CKA. The alignment circuit 150 outputs the delay output signals OUTD0 and OUTD180 as the alignment output signals OUTA0 and OUTA180, respectively, in synchronization with the alignment clock signal CKA. For example, the alignment circuit 150 outputs the first delay output signal OUTD0 as the first alignment output signal OUTA0 and outputs the second delay output signal OUTD180 as the second alignment output signal OUTA180 in synchronization with the rising edge of the alignment clock signal CKA. The first alignment output signal OUTA0 has a logic level that changes based on the logic level of the first delay output signal OUTD0, and the second alignment output signal OUTA180 has a logic level that changes based on the logic level of the second delay output signal OUTD180. The first alignment output signal OUTA0 and the second alignment output signal OUTA180 have substantially the same phase.

FIG. 2 is a block diagram illustrating a voltage information generation circuit 200 in accordance with an embodiment. Referring to FIG. 1 and FIG. 2, the receiver circuit 100 may further include the voltage information generation circuit 200. The voltage information generation circuit 200 receives a reference voltage setting signal VRS<0:m>. The reference voltage setting signal VRS<0:m> is a digital code signal including a plurality of bits, where m is an integer equal to 2 or more. The voltage information generation circuit 200 generates at least the high voltage signal VH and the low voltage signal VL based on the reference voltage setting signal VRS<0:m>. The voltage information generation circuit 200 may further generate the middle voltage signal VM based on the reference voltage setting signal VRS<0:m>. The reference voltage setting signal VRS<0:m> is a signal that sets or identifies the voltage level for the reference voltage VREF and includes information regarding the voltage level of the reference voltage VREF. The reference voltage setting signal VRS<0:m> includes information stored in a mode setting circuit and/or a register circuit of a semiconductor apparatus including the receiver circuit 100. For example, the reference voltage setting signal VRS<0:m> may be provided from a mode register set (MRS). The larger the logic value of the reference voltage setting signal VRS<0:m>, the higher the voltage level of the reference voltage VREF is, and the smaller the logic value of the reference voltage setting signal VRS<0:m>, the lower the voltage level of the reference voltage VREF is. The voltage information generation circuit 200 determines the logic value of the reference voltage setting signal VRS<0:m> and asserts one of the high voltage signal VH, the low voltage signal VL, and the middle voltage signal VM.

Figure 3A:
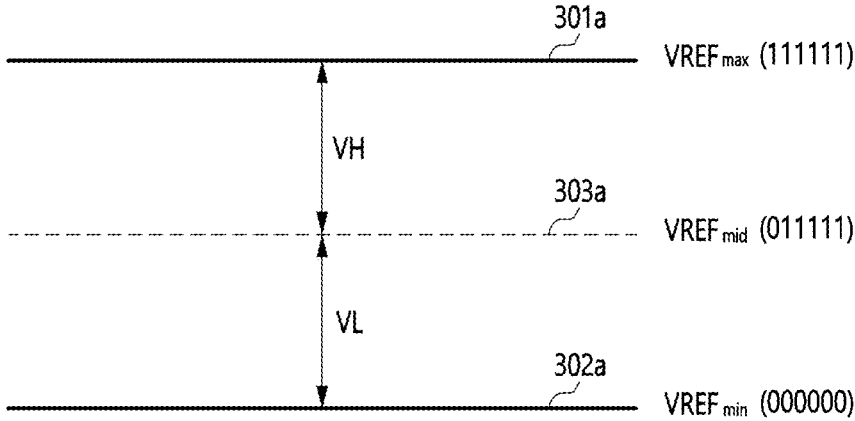
FIG. 3A is a voltage diagram applicable to operation of the voltage information generation circuit in accordance with an embodiment.

FIG. 3A is a voltage diagram applicable to operation of the voltage information generation circuit 200, for example, as shown in FIG. 2. Referring to FIG. 2 and FIG. 3A, the voltage information generation circuit 200 generates the high voltage signal VH and the low voltage signal VL according to the logic values of the reference voltage setting signal VRS<0:m> and/or the voltage level of the reference voltage VREF. The solid line 301a at the top of FIG. 3A indicates a high or maximum voltage level VREFmax of the reference voltage VREF. When the reference voltage setting signal VRS<0:m> includes 6 bits, the logic value of the reference voltage setting signal VRS<0:m> corresponding to the high or maximum voltage level VREFmax is 111111, for example. The solid line 302a at the bottom of FIG. 3A indicates a low or minimum voltage level VREFmin of the reference voltage VREF, and the logic value of the reference voltage setting signal VRS<0:m> corresponding to the low or minimum voltage level VREFmin is 000000, for example. The broken line 303a between the high or maximum voltage level VREFmax and the low or minimum voltage level VREFmin indicates a middle voltage level VREFmid, and the logic value of the reference voltage setting signal VRS<0:m> corresponding to the middle or center voltage level VREFmid is 011111, for example. The middle voltage level VREFmid may be the middle value halfway between the high or maximum voltage level VREFmax and the low or minimum voltage level VREFmin. The voltage information generation circuit 200 asserts the high voltage signal VH when the reference voltage setting signal VRS<0:m> has a logic value between 111111 and 011111, such as when the voltage level of the reference voltage VREF is between the high or maximum voltage level VREFmax and the middle voltage level VREFmid. The voltage information generation circuit 200 asserts the low voltage signal VL when the reference voltage setting signal VRS<0:m> has a logic value between 011111 and 000000, such as when the voltage level of the reference voltage VREF is between the middle voltage level VREFmid and the low or minimum voltage level VREFmin.

Figure 3B:
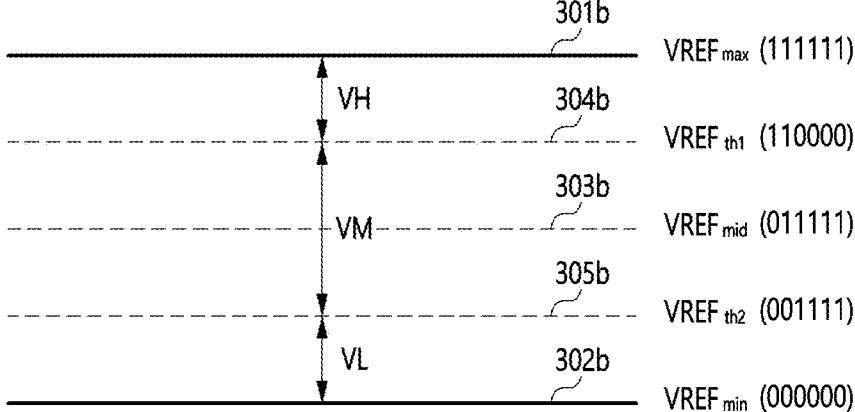
FIG. 3B is a voltage diagram applicable to operation of the voltage information generation circuit in accordance with an embodiment.

FIG. 3B is a voltage diagram applicable to operation of the voltage information generation circuit 200, for example, as shown in FIG. 2. Referring to FIG. 2 and FIG. 3B, the voltage information generation circuit 200 generates the high voltage signal VH, the middle voltage signal VM, and the low voltage signal VL according to the logic value of the reference voltage setting signal VRS<0:m> and/or the voltage level of the reference voltage VREF. The solid line 301b at the top of FIG. 3B indicates the high or maximum voltage level VREFmax of the reference voltage VREF. When the reference voltage setting signal VRS<0:m> includes 6 bits, the logic value of the reference voltage setting signal VRS<0:m> corresponding to the high or maximum voltage level VREFmax is 111111, for example. The solid line 302b at the bottom of FIG. 3B indicates the low or minimum voltage level VREFmin of the reference voltage VREF, and the logic value of the reference voltage setting signal VRS<0:m> corresponding to the low or minimum voltage level VREFmin is 000000, for example. The broken line 303b between the high or maximum voltage level VREFmax and the low or minimum voltage level VREFmin indicates the middle voltage level VREFmid, and the logic value of the reference voltage setting signal VRS<0:m> corresponding to the middle or center voltage level VREFmid may be 011111. The middle voltage level VREFmid may be the middle value halfway between the high or maximum voltage level VREFmax and the low or minimum voltage level VREFmin. A broken line 304b between the high or maximum voltage level VREFmax and the middle voltage level VREFmid indicates a first threshold voltage level VREFth1, and the logic value of the reference voltage setting signal VRS<0:m> corresponding to the first threshold voltage level VREFth1 is 110000, for example. The first threshold voltage level VREFth1 may be the middle value halfway between the high or maximum voltage level VREFmax and the middle voltage level VREFmid. Alternatively, the first threshold voltage level VREFth1 may be a voltage two-thirds of the voltage between the low or minimum voltage level VREFmin to the high or maximum voltage level VREFmax. The broken line 305b between the middle voltage level VREFmid and the low or minimum voltage level VREFmin indicates a second threshold voltage level VREFth2, and the logic value of the reference voltage setting signal VRS<0:m> corresponding to the second threshold voltage level VREFth2 is 001111, for example. The second threshold voltage level VREFth2 may be the middle value halfway between the low or minimum voltage level VREFmin and the middle voltage level VREFmid. Alternatively, the second threshold voltage level VREFth2 may be a voltage one-third of the voltage between the low or minimum voltage level VREFmin to the high or maximum voltage level VREFmax. The voltage information generation circuit 200 asserts the high voltage signal VH when the reference voltage setting signal VRS<0:m> has a logic value between 111111 and 110000, such as when the voltage level of the reference voltage VREF is between the high or maximum voltage level VREFmax and the first threshold voltage level VREFth1. The voltage information generation circuit 200 asserts the middle voltage signal VM when the reference voltage setting signal VRS<0:m> has a logic value between 110000 and 001111, such as when the voltage level of the reference voltage VREF is between the first threshold voltage level VREFth1 and the second threshold voltage level VREFth2. The voltage information generation circuit 200 asserts the low voltage signal VL when the reference voltage setting signal VRS<0:m> has a logic value between 001111 and 000000, such as when the voltage level of the reference voltage VREF is between the second threshold voltage level VREFth2 and the low or minimum voltage level VREFmin.

Figure 4A:
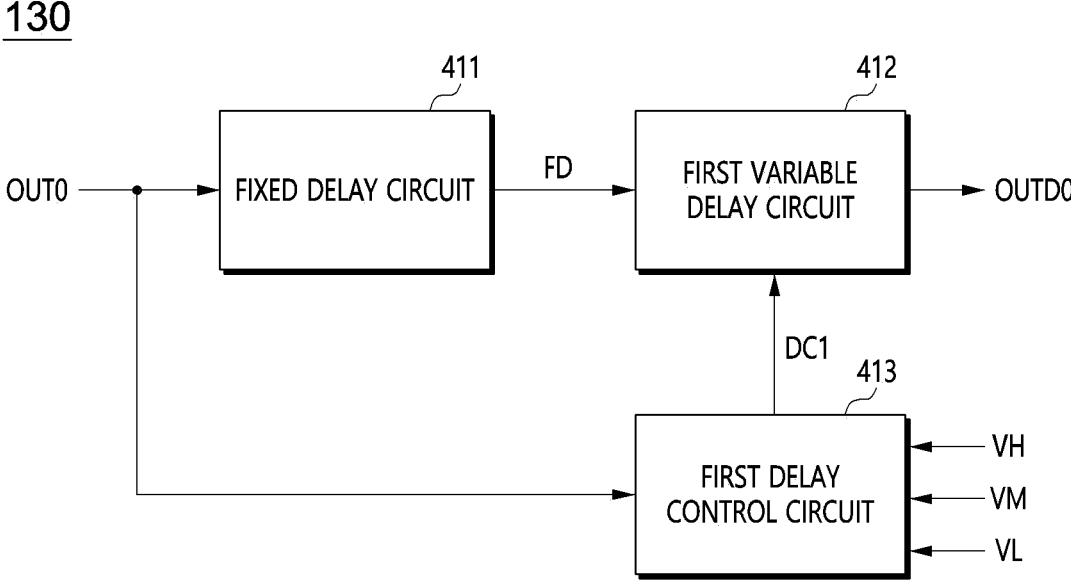
FIG. 4A is a diagram illustrating a configuration of a first delay circuit in accordance with an embodiment.

FIG. 4A is a diagram illustrating the configuration of the first delay circuit 130, for example, as shown in FIG. 2. Referring to FIG. 4A, the first delay circuit 130 includes a fixed delay circuit 411, a first variable delay circuit 412, and a first delay control circuit 413. The fixed delay circuit 411 receives the first output signal OUT0 and generates a fixed delay signal FD by delaying the first output signal OUT0 by a fixed delay time period. The delay time period of the fixed delay circuit 411 is, for example, a time period corresponding to a phase difference between the clock signal CK and the complementary clock signal CKB and is a time period corresponding to a half cycle of the clock signal CK or the complementary clock signal CKB. The first variable delay circuit 412 receives the fixed delay signal FD from the fixed delay circuit 411 and receives a first delay control signal DC1 from the first delay control circuit 413. The first variable delay circuit 412 generates the first delay output signal OUTD0 by variably delaying the fixed delay signal FD based on the first delay control signal DC1. The first delay control circuit 413 receives the first output signal OUT0, the high voltage signal VH, and the low voltage signal VL. The first delay control circuit 413 generates the first delay control signal DC1 based on the logic levels of the first output signal OUT0, the high voltage signal VH, and the low voltage signal VL. The first delay control circuit 413 generates the first delay control signal DC1 according to the logic levels of the first output signal OUT0 and an asserted signal that is one of the high voltage signal VH and the low voltage signal VL, for example. In an embodiment, the first delay control circuit 413 further receives the middle voltage signal VM. In this example, the first delay control circuit 413 generates the first delay control signal DC1 according to the logic levels of the first output signal OUT0 and an asserted signal among the high voltage signal VH, the middle voltage signal VM, and the low voltage signal VL.

Figure 4B:
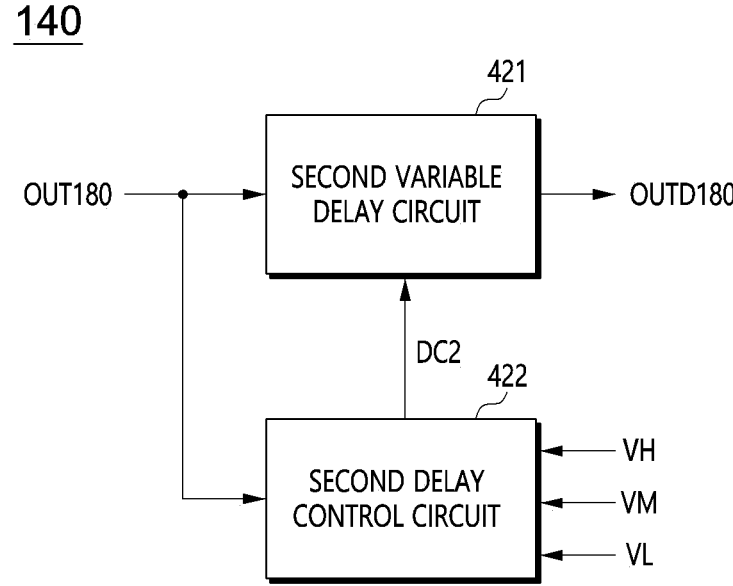
FIG. 4B is a diagram illustrating a configuration of a second delay circuit illustrated in accordance with an embodiment.

FIG. 4B is a diagram illustrating the configuration of the second delay circuit 140, for example, as illustrated in FIG. 2. Referring to FIG. 4B, the second delay circuit 140 includes a second variable delay circuit 421 and a second delay control circuit 422. The second variable delay circuit 421 receives the second output signal OUT180 and receives a second delay control signal DC2 from the second delay control circuit 422. The second variable delay circuit 421 generates the second delay output signal OUTD180 by variably delaying the second output signal OUT180 based on the second delay control signal DC2. The second delay control circuit 422 receives the second output signal OUT180, the high voltage signal VH, and the low voltage signal VL. The second delay control circuit 422 generates the second delay control signal DC2 based on the logic levels of the second output signal OUT180, the high voltage signal VH, and the low voltage signal VL. The second delay control circuit 422 generates the second delay control signal DC2 according to the logic levels of the second output signal OUT180 and an asserted signal that is one of the high voltage signal VH and the low voltage signal VL, for example. In an embodiment, the second delay control circuit 422 further receives the middle voltage signal VM. In this example, the second delay control circuit 422 generates the second delay control signal DC2 according to the logic levels of the second output signal OUT180 and an asserted signal among the high voltage signal VH, the middle voltage signal VM, and the low voltage signal VL.

Figure 5:
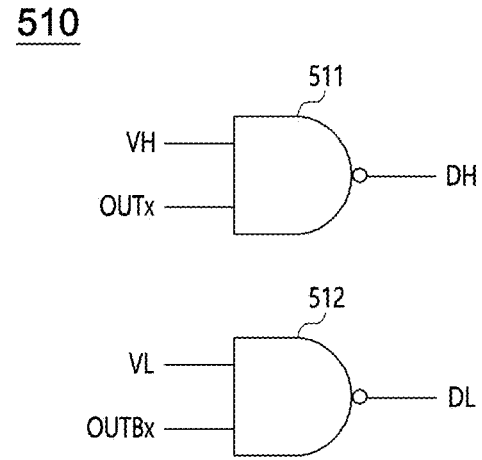
FIG. 5 is a diagram illustrating a configuration of a delay control circuit in accordance with an embodiment.

FIG. 5 is a diagram illustrating the configuration of a delay control circuit 510 in accordance with an embodiment. Referring to FIG. 5, the delay control circuit 510 receives the high voltage signal VH, the low voltage signal VL, and an output signal OUTx and generates a first control signal DH and a second control signal DL. The delay control circuit 510 generates the first control signal DH according to logic levels of the high voltage signal VH and the output signal OUTx and generate the second control signal DL according to logic levels of the low voltage signal VL and the output signal OUTx. The delay control circuit 510 includes a first NAND gate 511 and a second NAND gate 512. The first NAND gate 511 receives the high voltage signal VH and the output signal OUTx and generates the first control signal DH. The first NAND gate 511 de-asserts the first control signal DH when both the high voltage signal VH and the output signal OUTx are at a high logic level and asserts the first control signal DH when one or both of the high voltage signal VH and the output signal OUTx is at a low logic level. The second NAND gate 512 receives the low voltage signal VL and an output bar signal OUTBx and generates the second control signal DL. The output bar signal OUTBx has a logic level opposite to the logic level of the output signal OUTx. The second NAND gate 512 de-asserts the second control signal DL when both the low voltage signal VL and the output bar signal OUTBx are at a high logic level and asserts the second control signal DL when one or both of the low voltage signal VL and the output bar signal OUTBx is at a low logic level. The first delay control circuit 413 in FIG. 4A and the second delay control circuit 422 in FIG. 4B may be implemented similarly to the delay control circuit 510. When the first delay control circuit 413 is implemented similarly to the delay control circuit 510, the first output signal OUT0 is the output signal OUTx, and the first delay control signal DC1 includes the first control signal DH and the second control signal DL. When the second delay control circuit 422 is implemented similarly to the delay control circuit 510, the second output signal OUT180 is the output signal OUTx, and the second delay control signal DC2 includes the first control signal DH and the second control signal DL.

Figure 6:
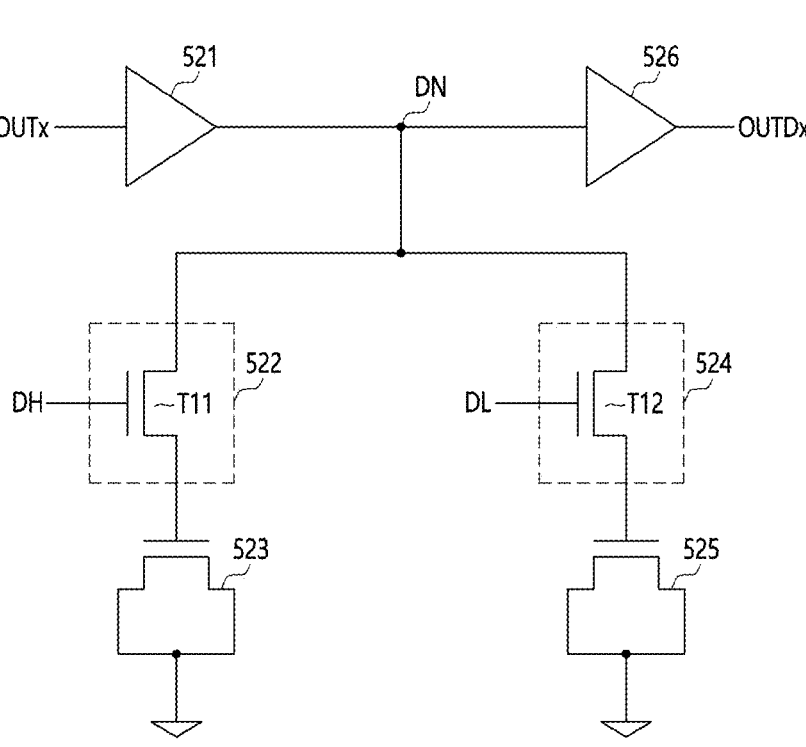
FIG. 6 is a diagram illustrating a configuration of a variable delay circuit in accordance with an embodiment.

FIG. 6 is a diagram illustrating the configuration of a variable delay circuit 520 in accordance with an embodiment. Referring to FIG. 6, the variable delay circuit 520 includes a first buffer 521, a first switch 522, a first capacitor 523, a second switch 524, a second capacitor 525, and a second buffer 526. The first buffer 521 receives the output signal OUTx, buffers the output signal OUTx, and outputs the buffered signal to a delay node DN. The first switch 522 is connected between the delay node DN and the first capacitor 523. The first switch 522 receives the first control signal DH and selectively connects the first capacitor 523 to the delay node DN based on the first control signal DH. The first switch 522 connects the first capacitor 523 to the delay node DN when the first control signal DH is asserted and disconnects the first capacitor 523 from the delay node DN when the first control signal DH is de-asserted. The first switch 522 include a first transistor T11. The first transistor T11 may be an N-channel MOS transistor. A gate of the first transistor T11 receives the first control signal DH, and a drain of the first transistor T11 is connected to the delay node DN. One end of the first capacitor 523 is connected to a source of the first transistor T11, and the other end of the first capacitor 523 is connected to a ground voltage. The first capacitor 523 may be a MOS capacitor.

The second switch 524 is connected between the delay node DN and the second capacitor 525. The second switch 524 receives the second control signal DL and selectively connects the second capacitor 525 to the delay node DN based on the second control signal DL. The second switch 524 connects the second capacitor 525 to the delay node DN when the second control signal DL is asserted and disconnects the second capacitor 525 from the delay node DN when the second control signal DL is de-asserted. The second switch 524 includes a second transistor T12. The second transistor T12 may be an N-channel MOS transistor. A gate of the second transistor T12 receives the second control signal DL, and a drain of the second transistor T12 is connected to the delay node DN. One end of the second capacitor 525 is connected to a source of the second transistor T12, and the other end of the second capacitor 525 is connected to the ground voltage. The second capacitor 525 may be a MOS capacitor. The capacitance of the second capacitor 525 may be substantially the same as the capacitance of the first capacitor 523. A delay time period caused by the second capacitor 525 is substantially the same as a delay time period caused by the first capacitor 523. The second buffer 526 receives a signal at the delay node DN, buffers the signal, and outputs a delay output signal OUTDx. The first variable delay circuit 412 illustrated in FIG. 4A and the second variable delay circuit 421 illustrated in FIG. 4B may be implemented similarly to the variable delay circuit 520. When the first variable delay circuit 412 is implemented similarly to the variable delay circuit 520, the fixed delay signal FD is the output signal OUTx, and the first delay output signal OUTD0 is the delay output signal OUTDx. When second variable delay circuit 421 is implemented similarly to the variable delay circuit 520, the second output signal OUT180 is the output signal OUTx, and the second delay output signal OUTD180 is the delay output signal OUTDx.

TABLE 1

| OUTx | OUTBx | VH | VL | DH | DL | Delay time period |
|------|-------|----|----|----|----|-------------------|
| 0 | 1 | 0 | 1 | 1 | 0 | $t_T - t_d$ |
| 0 | 1 | 1 | 0 | 1 | 1 | $t_T$ |
| 1 | 0 | 0 | 1 | 1 | 1 | $t_T$ |
| 1 | 0 | 1 | 0 | 0 | 1 | $t_T - t_d$ |

Table 1 includes data utilized during operation of the delay control circuit 510 and the variable delay circuit 520 illustrated in FIG. 5 and FIG. 6. When both switches 522 and 524 are turned on, the delay time period of the variable delay circuit 520 is largest, and the largest delay time period of the variable delay circuit 520 is tr. The delay time period caused by each of the first capacitor 523 and the second capacitor 525 is ta. When the low voltage signal VL is asserted and the logic level of the output signal OUTx is 0, the first control signal DH is asserted and the second control signal DL is de-asserted. When the first control signal DH is asserted and the second control signal DL is de-asserted, because the first switch 522 connects the first capacitor 523 to the delay node DN, the delay time period of the variable delay circuit 520 is $t_T - t_d$. When the high voltage signal VH is asserted and the logic level of the output signal OUTx is 0, both the control signals DH and DL are asserted. When both the control signals DH and DL are asserted, because the switches 522 and 524 connect both capacitors 523 and 525 to the delay node DN, the delay time period of the variable delay circuit 520 is tr. When the low voltage signal VL is asserted and the logic level of the output signal OUTx is 1, both control signals DH and DL are asserted. When both control signals DH and DL are asserted, because the switches 522 and 524 connect the capacitors 523 and 525 to the delay node DN, respectively, the delay time period of the variable delay circuit 520 is tr. When the high voltage signal VH is asserted and the logic level of the output signal OUTx is 1, the first control signal DH is de-asserted and the second control signal DL is asserted. When the first control signal DH is de-asserted and the second control signal DL is asserted, because the second switch 524 connects the second capacitor 525 to the delay node DN, the delay time period of the variable delay circuit 520 is $t_T - t_d$. Accordingly, when a difference between the voltage levels of the reference voltage VREF and the output signal OUTx is small, for example, when the low voltage signal VL is asserted and the logic level of the output signal OUTx is 0 or when the high voltage signal VH is asserted and the logic level of the output signal OUTx is 1, the delay time period of the variable delay circuit 520 is a shortest delay time period $t_T - t_d$. When the difference between the voltage levels of the reference voltage VREF and the output signal OUTx is large, for example, when the low voltage signal VL is asserted and the logic level of the output signal OUTx is 1 or when the high voltage signal VH is asserted and the logic level of the output signal OUTx is 0, the delay time period of the variable delay circuit 520 has a longest delay time period $t_T$.

Figure 7:
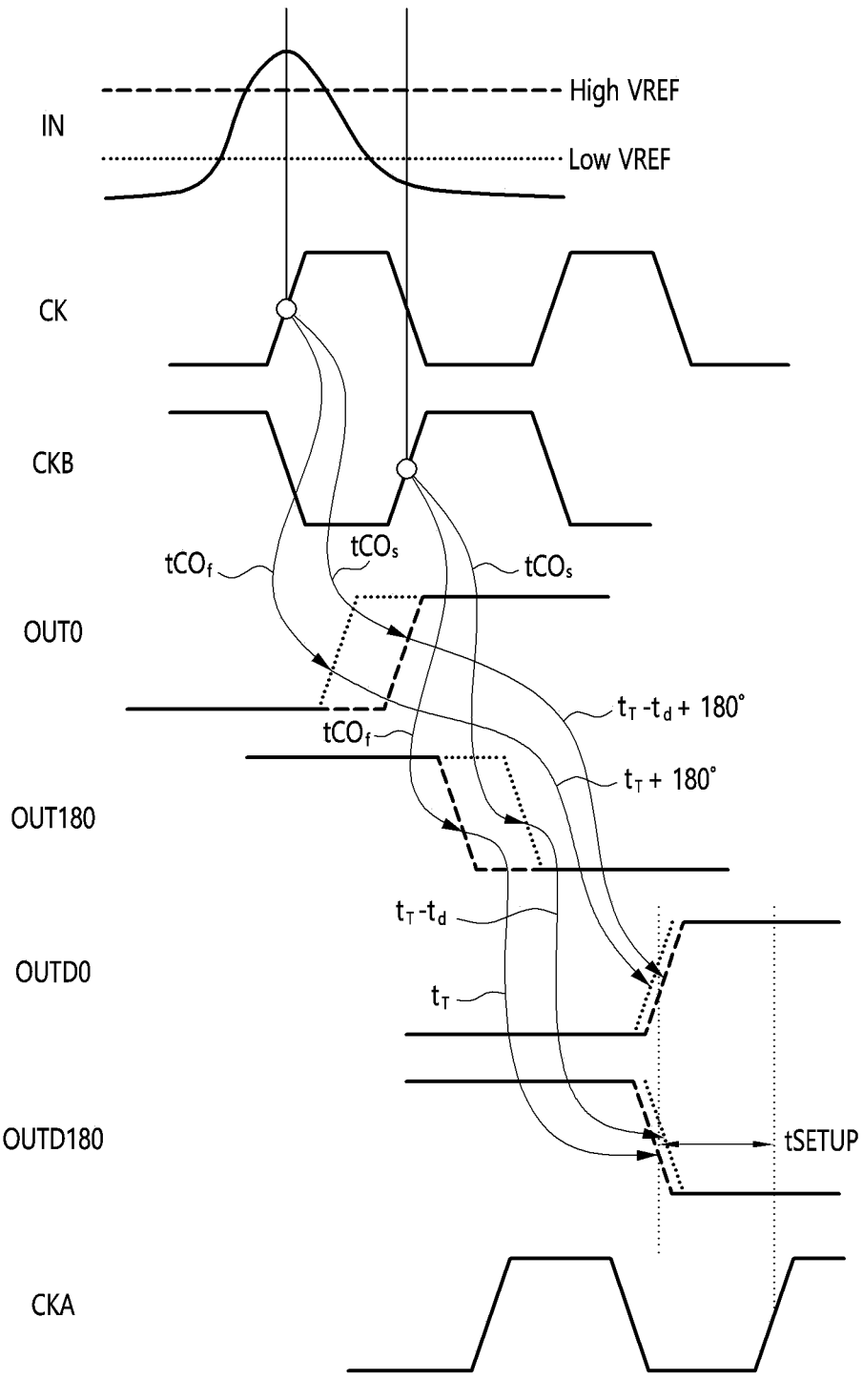
FIG. 7 is a timing diagram during operation of the receiver circuit in accordance with an embodiment.

FIG. 7 is a timing diagram during operation of the receiver circuit 100 in accordance with an embodiment. The operation of the receiver circuit 100 in accordance with an embodiment is described with reference to FIG. 1 to FIG. 7. In FIG. 7, the input signal IN transitions from a low logic level to a high logic level and subsequently transitions back to a low logic level. At the rising edge of the clock signal CK, the input signal IN is at a high logic level, and at the rising edge of the complementary clock signal CKB, the input signal IN is at a low logic level. When the reference voltage VREF is at a relatively high voltage level High VREF, the first output signal OUT0, the second output signal OUT180, the first delay output signal OUTD0, and the second delay output signal OUTD180 generated from the reference voltage VREF by the receiver circuit 100 are indicated by broken lines. When the reference voltage VREF is at a relatively low voltage level Low VREF, the first output signal OUT0, the second output signal OUT180, the first delay output signal OUTD0, and the second delay output signal OUTD180 generated from the reference voltage VREF by the receiver circuit 100 are indicated by dotted lines. When the voltage level of the reference voltage VREF is relatively high High VREF, the difference between the voltage level of the input signal IN and voltage level of the reference voltage VREF is small at the rising edge of the clock signal CK. Accordingly, the first output signal OUT0 is generated relatively late by the first receiver 110, and the first output signal OUT0 transitions from a low logic level to a high logic level after a delay time period $tCO_s$ from the rising edge of the clock signal CK. When the voltage level of the reference voltage VREF is relatively low Low VREF, the difference between the voltage level of the input signal IN and the voltage level of the reference voltage VREF may be large at the rising edge of the clock signal CK. Accordingly, the first output signal OUT0 is generated relatively quickly by the first receiver 110, and the first output signal OUT0 transitions from a low logic level to a high logic level after a delay time period $tCO_f$ from the rising edge of the clock signal CK. In the example of FIG. 7, $tCO_s$ is longer than $tCO_f$. When the voltage level of the reference voltage VREF is relatively high High VREF, the voltage information generation circuit 200 asserts the high voltage signal VH, the fixed delay circuit 411 of the first delay circuit 130 generates the fixed delay signal FD by delaying the first output signal OUT0 by a delay time period corresponding to a half cycle or a phase of 180° with respect to the phase of the clock signal CK, and the first variable delay circuit 412 generates the first delay output signal OUTD0 by delaying the fixed delay signal FD by $t_T - t_d$. Accordingly, the delay time period from the first output signal OUT0 until the first delay output signal OUTD0 is generated as $t_T - t_d + 180°$, and the delay time period from the rising edge of the clock signal CK until the first delay output signal OUTD0 is generated may be $tCO_s + t_T - t_d + 180°$. When the voltage level of the reference voltage VREF is relatively low Low VREF, the voltage information generation circuit 200 asserts the low voltage signal VL, the fixed delay circuit 411 of the first delay circuit 130 generates the fixed delay signal FD by delaying the first output signal OUT0 by a delay time period corresponding to a half cycle or a phase of 180° with respect to the phase of the clock signal CK, and the first variable delay circuit 412 generates the first delay output signal OUTD0 by delaying the fixed delay signal FD by $t_T$. Accordingly, the delay time period from the first output signal OUT0 until the first delay output signal OUTD0 is generated as $t_T$+180°, and the delay time period from the rising edge of the clock signal CK until the first delay output signal OUTD0 is generated as $tCO_f$+ $t_T$+180°. Because ta compensates for the difference between $tCO_s$ and $tCO_f$, the first delay output signal OUTD0 indicated by the broken line and the first delay output signal OUTD0 indicated by the dotted line are generated at substantially the same time.

When the voltage level of the reference voltage VREF is relatively high High VREF, the difference between the voltage level of the input signal IN and the voltage level of the reference voltage VREF is large at the rising edge of the complementary clock signal CKB. Accordingly, the second output signal OUT180 is generated relatively quickly by the second receiver 120, and the second output signal OUT180 transitions from a high logic level to a low logic level after a delay time period $tCO_f$ from the rising edge of the complementary clock signal CKB. When the voltage level of the reference voltage VREF is relatively low Low VREF, the difference between the voltage level of the input signal IN and the voltage level of the reference voltage VREF is small at the rising edge of the complementary clock signal CKB. Accordingly, the second output signal OUT180 is generated relatively late by the second receiver 120, and the second output signal OUT180 transitions from a high logic level to a low logic level after a delay time period $tCO_s$ from the rising edge of the complementary clock signal CKB. When the voltage level of the reference voltage VREF is relatively high High VREF, the voltage information generation circuit 200 asserts the high voltage signal VH, and the variable delay circuit 421 of the second delay circuit 140 generates the second delay output signal OUTD180 by delaying the second output signal OUT180 by time period tr. Accordingly, the delay time period from the second output signal OUT180 until the second delay output signal OUTD180 is generated is $t_T$, and the delay time period from the rising edge of the complementary clock signal CKB until the second delay output signal OUTD180 is generated is $tCO_f$+ $t_T$. When the voltage level of the reference voltage VREF is relatively low Low VREF, the voltage information generation circuit 200 asserts the low voltage signal VL, and the second variable delay circuit 421 generates the second delay output signal OUTD180 by delaying the second output signal OUT180 by time period $t_T$-$t_d$. Accordingly, the delay time period from the second output signal OUT180 until the second delay output signal OUTD180 is generated is $t_T$-$t_d$, and the delay time period from the rising edge of the complementary clock signal CKB until the second delay output signal OUTD180 is generated is $tCO_s$+$t_T$-$t_d$. Because ta compensates for the difference between $tCO_s$ and $tCO_f$, the second delay output signal OUTD180 indicated by the broken line and the second delay output signal OUTD180 indicated by the dotted line are generated at substantially the same time. The delay output signals OUTD0 and OUTD180 indicated by the broken lines and the delay output signals OUTD0 and OUTD180 indicated by the dotted lines are generated at substantially the same time. For example, the first delay period for the first delay output signal OUTD0 and the second delay period for the second delay output signal OUTD180 are selected such that the first delay output signal OUTD0 and the second delay output signal OUTD180 are substantially aligned in time. The alignment circuit 150 generates the delay output signals OUTD0 and OUTD180 as the alignment output signals OUTA0 and OUTA180 in synchronization with the alignment clock signal CKA. Because the delay output signals OUTD0 and OUTD180 are generated at substantially the same time regardless of the voltage level of the reference voltage VREF and the logic level of the input signal IN, a setup margin tSETUP for the alignment circuit 150 may be sufficiently established or secured and a hold margin may also be established or secured.

Figure 8:
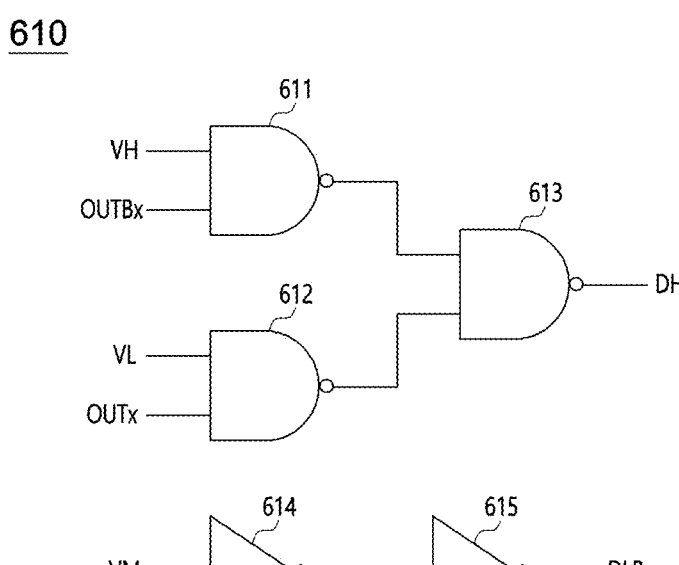
FIG. 8 is a diagram illustrating a configuration of a delay control circuit in accordance with an embodiment.

FIG. 8 is a diagram illustrating the configuration of a delay control circuit 610 in accordance with an embodiment. Referring to FIG. 8, the delay control circuit 610 receives a high voltage signal VH, a middle voltage signal VM, a low voltage signal VL, and an output signal OUTx, and generates a first control signal DH and a second control signal DLB. The delay control circuit 610 generates the first control signal DH according to the logic levels of the high voltage signal VH, the low voltage signal VL, and the output signal OUTx, and generates the second control signal DLB according to the logic level of the middle voltage signal VM. The delay control circuit 610 includes a first NAND gate 611, a second NAND gate 612, a third NAND gate 613, a first inverter 614, and a second inverter 615. The first NAND gate 611 receives the high voltage signal VH and an output bar signal OUTBx. The output bar signal OUTBx has a logic level opposite to the logic level of the output signal OUTx. The second NAND gate 612 receives the low voltage signal VL and the output signal OUTx. The third NAND gate 613 receives outputs of the NAND gates 611 and 612 and generates the first control signal DH. The third NAND gate 613 de-asserts the first control signal DH when the outputs of the NAND gates 611 and 612 both are at a high logic level, and asserts the first control signal DH when any of the outputs of the NAND gates 611 and 612 are at a low logic level. The first inverter 614 receives the middle voltage signal VM and inverts the middle voltage signal VM. The second inverter 615 receives the output of the first inverter 614 and inverts the output of the first inverter 614 to generate the second control signal DLB. The inverters 614 and 615 assert the second control signal DLB when the middle voltage signal VM is asserted, and de-asserts the second control signal DLB when the middle voltage signal VM is de-asserted. The first delay control circuit 413 in FIG. 4A and the second delay control circuit 422 in FIG. 4B may be implemented similarly to the delay control circuit 610. When the first delay control circuit 413 is implemented similarly to the delay control circuit 610, the first output signal OUT0 is the output signal OUTx, and the first delay control signal DC1 includes the first control signal DH and the second control signal DLB. When the second delay control circuit 422 is implemented similarly to the delay control circuit 610, the second output signal OUT180 is the output signal OUTx, and the second delay control signal DC2 includes the first control signal DH and the second control signal DLB.

Figure 9:
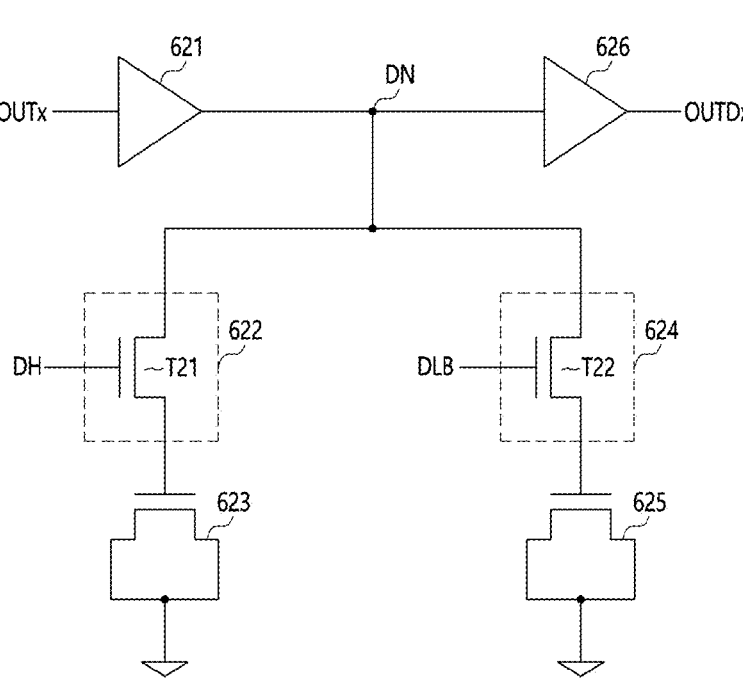
FIG. 9 is a diagram illustrating a configuration of a variable delay circuit in accordance with an embodiment.

FIG. 9 is a diagram illustrating the configuration of a variable delay circuit 620 in accordance with an embodiment. Referring to FIG. 9, the variable delay circuit 620 includes a first buffer 621, a first switch 622, a first capacitor 623, a second switch 624, a second capacitor 625, and a second buffer 626. The first buffer 621 receives the output signal OUTx, buffers the output signal OUTx, and outputs the buffered signal to a delay node DN. The first switch 622 is connected between the delay node DN and the first capacitor 623. The first switch 622 receives the first control signal DH and selectively connects the first capacitor 623 to the delay node DN based on the first control signal DH. The first switch 622 connects the first capacitor 623 to the delay node DN when the first control signal DH is asserted and disconnects the first capacitor 623 from the delay node DN when the first control signal DH is de-asserted. The first switch 622 includes a first transistor T21. The first transistor T21 may be an N-channel MOS transistor. A gate of the first transistor T21 receives the first control signal DH, and a drain of the first transistor T21 is connected to the delay node DN. One end of the first capacitor 623 is connected to a source of the first transistor T21, and the other end of the first capacitor 623 is connected to the ground voltage. The first capacitor 623 may be a MOS capacitor.

The second switch 624 is connected between the delay node DN and the second capacitor 625. The second switch 624 receives the second control signal DLB and selectively connects the second capacitor 625 to the delay node DN based on the second control signal DLB. The second switch 624 connects the second capacitor 625 to the delay node DN when the second control signal DLB is asserted and disconnects the second capacitor 625 from the delay node DN when the second control signal DLB is de-asserted. The second switch 624 includes a second transistor T22. The second transistor T22 may be an N-channel MOS transistor. A gate of the second transistor T22 receives the second control signal DLB, and a drain of the second transistor T22 is connected to the delay node DN. One end of the second capacitor 625 is connected to a source of the second transistor T22, and the other end of the second capacitor 625 is connected to the ground voltage. The second capacitor 625 may be a MOS capacitor. The capacitance of the first capacitor 623 may be greater than the capacitance of the second capacitor 625, and a delay time period caused by the first capacitor 623 may be longer than a delay time period caused by the second capacitor 625. The second buffer 626 receives a signal at the delay node DN, buffers the signal, and outputs a delay output signal OUTDx. The first variable delay circuit 412 illustrated in FIG. 4A and the second variable delay circuit 421 illustrated in FIG. 4B may be implemented similarly to the variable delay circuit 620. When the first variable delay circuit 412 is implemented similarly to the variable delay circuit 620, the fixed delay signal FD is the output signal OUTx, and the first delay output signal OUTD0 is the delay output signal OUTDx. When the second variable delay circuit 421 is implemented similarly to the variable delay circuit 620, the second output signal OUT180 is the output signal OUTx, and the second delay output signal OUTD180 is the delay output signal OUTDX.

TABLE 2

| OUTx | VH | VM | VL | DH | DLB | Delay time period |
|---|---|---|---|---|---|---|
| 0 | 0 | 0 | 1 | 0 | 0 | $t_M$ |
| 0 | 0 | 1 | 0 | 0 | 1 | $t_M + t_{d1}$ |
| 0 | 1 | 0 | 0 | 1 | 0 | $t_M + t_{d1} + t_{d2}$ |
| 1 | 0 | 0 | 1 | 1 | 0 | $t_M + t_{d1} + t_{d2}$ |
| 1 | 0 | 1 | 0 | 0 | 1 | $t_M + t_{d1}$ |
| 1 | 1 | 0 | 0 | 0 | 0 | $t_M$ |

Table 2 includes data utilized during operation of the delay control circuit 610 and the variable delay circuit 620 illustrated in FIG. 8 and FIG. 9. When both the first and second switches 622 and 624 are turned off, the delay time period caused by the variable delay circuit 620 is shortest, and the shortest minimum delay time period of the variable delay circuit 620 is ty. A delay time period due to the first capacitor 623 is $t_{d1}+t_{d2}$. A delay time period due to the second capacitor 625 is $t_{d1}$. When the low voltage signal VL is asserted and the logic level of the output signal OUTx is 0, both the control signals DH and DLB are de-asserted. When the control signals DH and DLB are de-asserted, because both second switches 622 and 624 are turned off, the delay time period of the variable delay circuit 620 is $t_M$. When the middle voltage signal VM is asserted and the logic level of the output signal OUTx is 0, the first control signal DH is de-asserted and the second control signal DLB is asserted. When the first control signal DH is de-asserted and the second control signal DLB is asserted, because the second switch 622 connects the second capacitor 625 to the delay node DN, the delay time period of the variable delay circuit 620 is $t_M+t_{d1}$. When the high voltage signal VH is asserted and the logic level of the output signal OUTx is 0, the first control signal DH is asserted and the second control signal DLB is de-asserted. When the first control signal DH is asserted and the second control signal DLB is de-asserted, the first switch 622 connects the first capacitor 623 to the delay node DN, the delay time period of the variable delay circuit 620 is $t_M+t_{d1}+t_{d2}$. When the low voltage signal VL is asserted and the logic level of the output signal OUTx is 1, the first control signal DH is asserted and the second control signal DLB is de-asserted. When the first control signal DH is asserted and the second control signal DLB is de-asserted, because the first switch 622 connects the first capacitor 623 to the delay node DN, the delay time period of the variable delay circuit 620 is $t_M+t_{d1}+t_{d2}$. When the middle voltage signal VM is asserted and the logic level of the output signal OUTx is 1, the first control signal DH is de-asserted and the second control signal DLB is asserted. When the first control signal DH is de-asserted and the second control signal DLB is asserted, because the second switch 624 connects the second capacitor 625 to the delay node DN, the delay time period of the variable delay circuit 620 is $t_M+t_{d1}$. When the high voltage signal VH is asserted and the logic level of the output signal OUTx is 1, both the control signals DH and DLB are de-asserted. When the control signals DH and DLB are de-asserted, because both the switches 622 and 624 are turned off, the delay time period of the variable delay circuit 620 is $t_M$. Accordingly, when the difference between the voltage level of the reference voltage VREF and the voltage level of the output signal OUTx is small, for example, when the low voltage signal VL is asserted and the logic level of the output signal OUTx is 0 or when the high voltage signal VH is asserted and the logic level of the output signal OUTx is 1, the delay time period of the variable delay circuit 620 is a shortest delay time period $t_M$. When the difference between the voltage level of the reference voltage VREF and the voltage level of the output signal OUTx is large, for example, when the low voltage signal VL is asserted and the logic level of the output signal OUTx is 1 or when the high voltage signal VH is asserted and the logic level of the output signal OUTx is 0, the delay time period of the variable delay circuit 620 is a longest delay time period $t_M+t_{d1}+t_{d2}$. When the difference between the voltage level of the reference voltage VREF and the voltage level of the output signal OUTx is medium (not large and not small), for example, when the middle voltage signal VM is asserted and the logic level of the output signal OUTx is 0 or 1, the delay time period of the variable delay circuit 620 is a middle or medium-valued delay time period $t_M+t_{d1}$.

Figure 10:
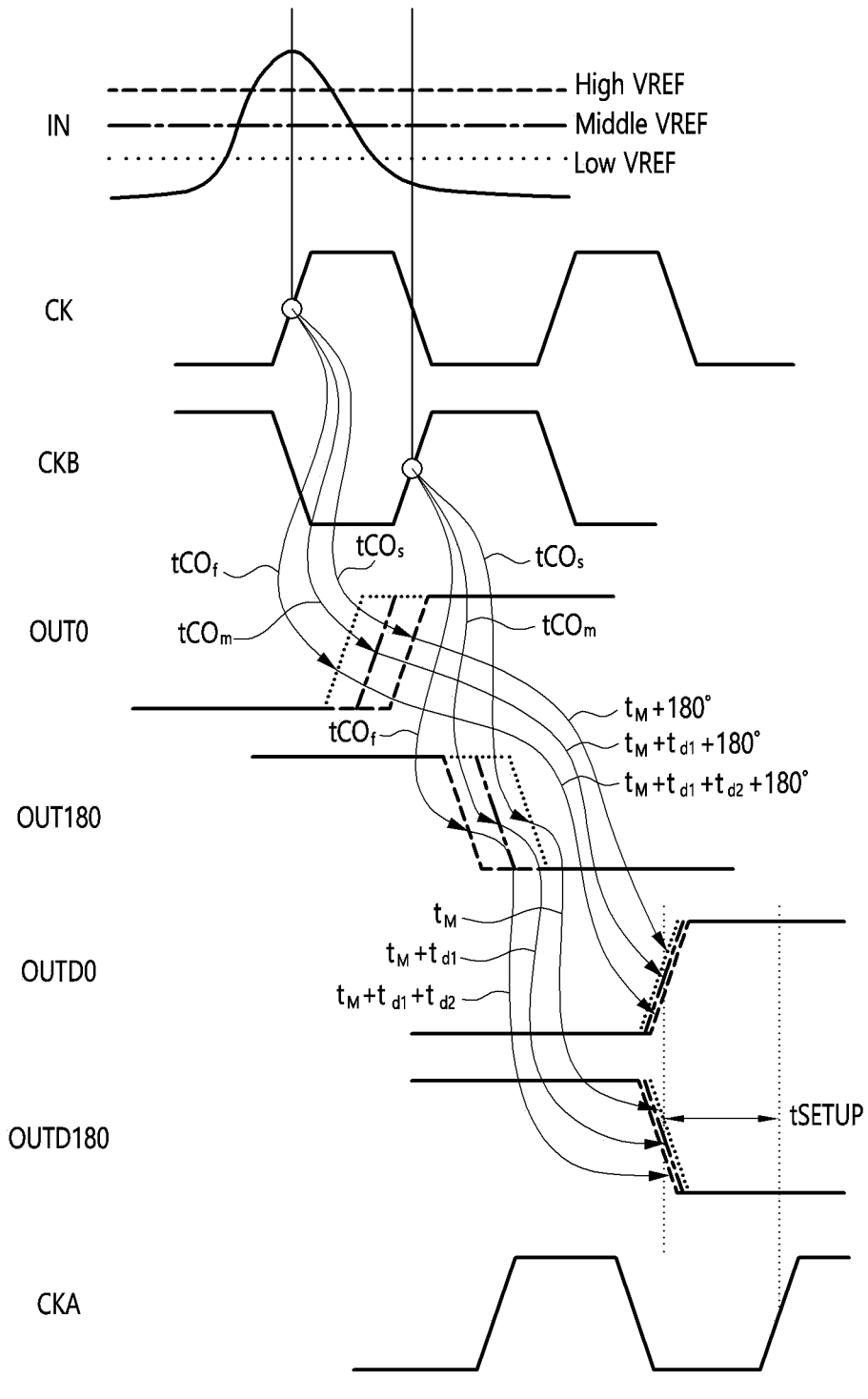
FIG. 10 is a timing diagram during operation of the receiver circuit in accordance with an embodiment.

FIG. 10 is a timing diagram during operation of the receiver circuit 100 in accordance with an embodiment. The operation of the receiver circuit 100 in accordance with an embodiment is described with reference to FIG. 1, FIG. 2, FIG. 3A, FIG. 3B, FIG. 4A, FIG. 4B, and FIG. 8 to FIG. 10. In FIG. 10, the input signal IN transitions from a low logic level to a high logic level and subsequently transitions back to a low logic level. At the rising edge of the clock signal CK, the input signal IN is at a high logic level, and at the rising edge of the complementary clock signal CKB, the input signal IN is at a low logic level. When the reference voltage VREF falls within a high voltage level range High VREF, the first output signal OUT0, the second output signal OUT180, the first delay output signal OUTD0, and the second delay output signal OUTD180 generated from the reference voltage VREF by the receiver circuit 100 are indicated by broken lines. When the reference voltage VREF falls within a low voltage level range Low VREF, the first output signal OUT0, the second output signal OUT180, the first delay output signal OUTD0, and the second delay output signal OUTD180 generated from the reference voltage VREF by the receiver circuit 100 are indicated by dotted lines. When the reference voltage VREF falls within a middle voltage level range Middle VREF, the first output signal OUT0, the second output signal OUT180, the first delay output signal OUTD0, and the second delay output signal OUTD180 generated from the reference voltage VREF by the receiver circuit 100 are indicated by dashed-dotted lines.

When the reference voltage VREF falls within the high voltage level range High VREF, the difference between the voltage level of the input signal IN and the voltage level of the reference voltage VREF is small at the rising edge of the clock signal CK. Accordingly, the first output signal OUT0 is generated relatively late by the first receiver 110, and the first output signal OUT0 transitions from a low logic level to a high logic level after a delay time period $tCO_s$ from the rising edge of the clock signal CK. When the reference voltage VREF falls within the low voltage level range Low VREF, the difference between the voltage level of the input signal IN and the voltage level of the reference voltage VREF is large at the rising edge of the clock signal CK. Accordingly, the first output signal OUT0 is generated relatively quickly by the first receiver 110, and the first output signal OUT0 transitions from a low logic level to a high logic level after a delay time period $tCO_f$ from the rising edge of the clock signal CK. When the reference voltage VREF falls within the middle voltage level range, the difference between the voltage level of the input signal IN and the voltage level of the reference voltage VREF is medium-sized, for example, neither relatively large nor relatively small or in the middle of the voltage range of the input signal IN. Accordingly, the first receiver 110 facilitates the first output signal OUT0 to transition from a low logic level to a high logic level after a delay time period $tCO_m$ from the rising edge of the clock signal CK. In this example, $tCO_s$ is longer than $tCO_m$, and $tCO_m$ is longer than $tCO_f$. When the reference voltage VREF falls within the high voltage level range High VREF, the voltage information generation circuit 200 asserts the high voltage signal VH, the fixed delay circuit 411 of the first delay circuit 130 generates the fixed delay signal FD by delaying the first output signal OUT0 by a delay time period corresponding to a half cycle or a phase of 180° with respect to the phase of the clock signal CK, and the first variable delay circuit 412 generates the first delay output signal OUTD0 by delaying the fixed delay signal FD by $t_M$. Accordingly, the delay time period from the first output signal OUT0 until the first delay output signal OUTD0 is generated is $t_M + 180°$, and the delay time period from the rising edge of the clock signal CK until the first delay output signal OUTD0 is generated may be $tCO_s + t_M + 180°$. When the reference voltage VREF falls within the low voltage level range Low VREF, the voltage information generation circuit 200 asserts the low voltage signal VL, the fixed delay circuit 411 of the first delay circuit 130 generates the fixed delay signal FD by delaying the first output signal OUT0 by a delay time period corresponding to a half cycle or a phase of 180° with respect to the phase of the clock signal CK, and the first variable delay circuit 412 generates the first delay output signal OUTD0 by delaying the fixed delay signal FD by $t_M + t_{d1} + t_{d2}$. Accordingly, the delay time period from the first output signal OUT0 until the first delay output signal OUTD0 is generated is $t_M + t_{d1} + t_{d2} + 180°$, and the delay time period from the rising edge of the clock signal CK until the first delay output signal OUTD0 is generated is $tCO_f + t_M + t_{d1} + t_{d2} + 180°$. When the reference voltage VREF falls within the middle voltage level range Middle VREF, the voltage information generation circuit 200 asserts the middle voltage signal VM, the fixed delay circuit 411 of the first delay circuit 130 generates the fixed delay signal FD by delaying the first output signal OUT0 by a delay time period corresponding to a half cycle or a phase of 180° with respect to the phase of the clock signal CK, and the first variable delay circuit 412 generates the first delay output signal OUTD0 by delaying the fixed delay signal FD by $t_M + t_{d1}$. Accordingly, the delay time period from the first output signal OUT0 until the first delay output signal OUTD0 is generated is $t_M + t_{d1} + 180°$, and the delay time period from the rising edge of the clock signal CK until the first delay output signal OUTD0 is generated is $tCO_m + t_M + t_{d1} + 180°$. Accordingly, the first delay output signal OUTD0 indicated by the broken line, the first delay output signal OUTD0 indicated by the dotted line, and the first delay output signal OUTD0 indicated by the dashed-dotted line are generated at substantially the same time.

When the reference voltage VREF falls within the high voltage level range High VREF, the difference between the voltage level of the input signal IN and the voltage level of the reference voltage VREF is large at the rising edge of the complementary clock signal CKB. Accordingly, the second output signal OUT180 is generated relatively quickly by the second receiver 120, and the second output signal OUT180 transitions from a high logic level to a low logic level after a delay time period $tCO_f$ from the rising edge of the complementary clock signal CKB. When the reference voltage VREF falls within the low voltage level range Low VREF, the difference between the voltage level of the input signal IN and the voltage level of the reference voltage VREF is small at the rising edge of the complementary clock signal CKB. Accordingly, the second output signal OUT180 is generated relatively late by the second receiver 120 and transitions from a high logic level to a low logic level after a delay time period $tCO_s$ from the rising edge of the complementary clock signal CKB. When the reference voltage VREF falls within the middle voltage level range Middle VREF, the difference between the voltage level of the input signal IN and the voltage level of the reference voltage VREF is medium-sized, for example, neither relatively large nor relatively small or in the middle of the voltage range of the input signal IN. Accordingly, the second receiver 120 facilitates the second output signal OUT180 to transition from a high logic level to a low logic level after a delay time period $tCO_m$ from the rising edge of the complementary clock signal CKB. When the reference voltage VREF falls within the high voltage level range High VREF, the voltage information generation circuit 200 asserts the high voltage signal VH, and the second variable delay circuit 421 of the second delay circuit 140 generates the second delay output signal OUTD180 by delaying the second output signal OUT180 by $t_M + t_{d1} + t_{d2}$. Accordingly, the delay time period from the second output signal OUT180 until the second delay output signal OUTD180 is generated is $t_M + t_{d1} + t_{d2}$, and the delay time period from the rising edge of the complementary clock signal CKB until the second delay output signal OUTD180 is generated is $tCO_f + t_M + t_{d1} + t_{d2}$. When the reference voltage VREF falls within the low voltage level range Low VREF, the voltage information generation circuit 200 asserts the low voltage signal VL, and the second variable delay circuit 421 generates the second delay output signal OUTD180 by delaying the second output signal OUT180 by $t_M$. Accordingly, the delay time period from the second output signal OUT180 until the second delay output signal OUTD180 is generated is $t_M$, and the delay time period from the rising edge of the complementary clock signal CKB until the second delay output signal OUTD180 is generated is $tCO_s + t_M$. When the reference voltage VREF falls within the middle voltage level range Middle VREF, the voltage information generation circuit 200 may assert the middle voltage signal VM, and the second variable delay circuit 421 generates the second delay output signal OUTD180 by delaying the second output signal OUT180 by $t_M + t_{d1}$. Accordingly, the delay time period from the second output signal OUT180 until the second delay output signal OUTD180 is generated is $t_M + t_{d1}$, and the delay time period from the rising edge of the complementary clock signal CKB until the second delay output signal OUTD180 is generated is $tCO_m + t_M + t_{d1}$. Accordingly, the second delay output signal OUTD180 indicated by the broken line, the second delay output signal OUTD180 indicated by the dotted line, and the second delay output signal OUTD180 indicated by the dashed-dotted line are generated at substantially the same time. The delay output signals OUTD0 and OUTD180 indicated by the broken lines, the delay output signals OUTD0 and OUTD180 indicated by the dotted lines, and the delay output signals OUTD0 and OUTD180 indicated by the dashed-dotted lines are generated at substantially the same time. The alignment circuit 150 generates the delay output signals OUTD0 and OUTD180 as the alignment output signals OUTA0 and OUTA180 in synchronization with the alignment clock signal CKA. Because the delay output signals OUTD0 and OUTD180 are generated at substantially the same time regardless of the voltage level of the reference voltage VREF and the logic level of the input signal IN, the setup margin tSETUP of the alignment circuit 150 may be sufficiently established or secured and the hold margin may also be established or secured.

Figure 11:
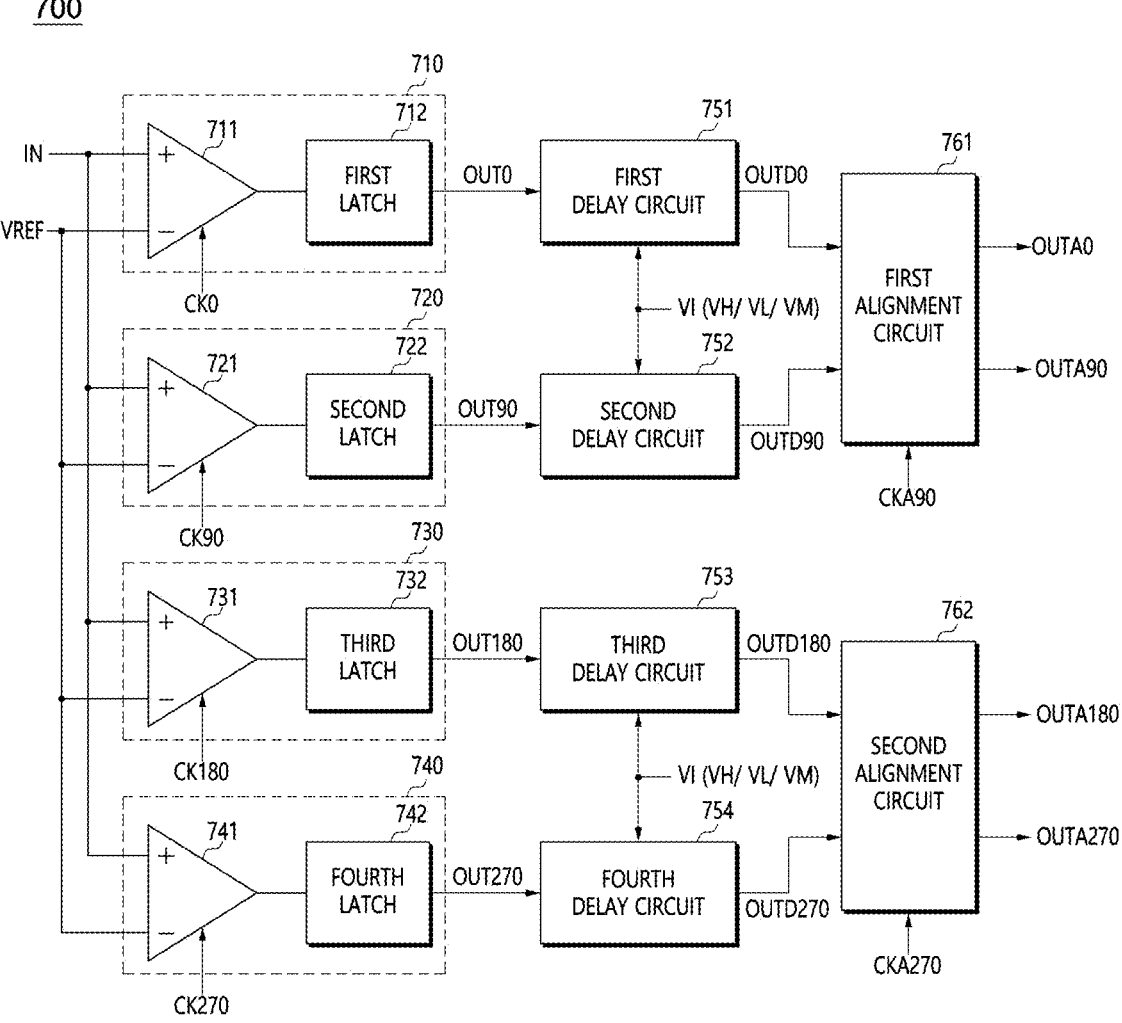
FIG. 11 is a diagram illustrating a configuration of a receiver circuit in accordance with an embodiment.

FIG. 11 is a diagram illustrating the configuration of a receiver circuit 700 in accordance with an embodiment. Although the receiver circuit 100 illustrated in FIG. 1 performs a half-rate operation, the receiver circuit 700 performs a quarter-rate operation. Referring to FIG. 11, the receiver circuit 700 receives the input signal IN in synchronization with first clock signals CK0, the second clock signal CK90, the third clock signal CK180, and the fourth clock signal CK270. The phase difference between the clock signals CK0, CK90, CK180, and CK270 is 90°. The phase of the first clock signal CK0 is 90° ahead of the phase of the second clock signal CK90, and the phase of the second clock signal CK90 is 90° ahead of the phase of the third clock signal CK180. The phase of the third clock signal CK180 is 90° ahead of the phase of fourth clock signal CK270, and the phase of the fourth clock signal CK270 is 90° ahead of the phase of first clock signal CK0. The receiver circuit 700 uses a reference voltage VREF to receive the input signal IN. The reference voltage VREF is at a voltage level corresponding to the middle or center of a range within which the input signal IN swings or a voltage level corresponding to the middle voltage level at a midpoint between the high or maximum voltage level and the low or minimum voltage level of the input signal IN. The receiver circuit 700 generates a first output signal OUT0, a second output signal OUT90, a third output signal OUT180, and a fourth output signal OUT270 by differentially amplifying the input signal IN and the reference voltage VREF in synchronization with the clock signal CK0, the clock signal CK90, the clock signal CK180, and the clock signal CK270, respectively, and generates a first delay output signal OUTD0, a second delay output signal OUTD90, a third delay output signal OUTD180, and a fourth delay output signal OUTD270, respectively, by delaying the output signals OUT0, OUT90, OUT180, and OUT270. The receiver circuit 700 further receives a first alignment clock signal CKA90 and a second alignment clock signal CKA270. The receiver circuit 700 generates a first alignment output signal OUTA0 and a second alignment output signal OUTA90 from the first delay output signal OUTD0 and the second delay output signal OUTD90 based on the first alignment clock signal CKA90, respectively, and generates a third alignment output signal OUTA180 and a fourth alignment output signal OUTA270 from the third delay output signal OUTD180 and the fourth delay output signal OUTD270 based on the second alignment clock signal CKA270. The phase of the second alignment clock signal CKA270 is delayed compared to the phase of the first alignment clock signal CKA90. For example, the phase of the second alignment clock signal CKA270 is 180° later than the phase of the first alignment clock signal CKA90.

The receiver circuit 700 includes a first receiver 710, a second receiver 720, a third receiver 730, a fourth receiver 740, a first delay circuit 751, a second delay circuit 752, a third delay circuit 753, a fourth delay circuit 754, a first alignment circuit 761, and a second alignment circuit 762. The first receiver 710 receives the first clock signal CK0, the input signal IN, and the reference voltage VREF and generates the first output signal OUT0 by differentially amplifying the input signal IN and the reference voltage VREF in synchronization with the first clock signal CK0. The first receiver 710 includes a first comparator 711 and a first latch 712. The first comparator 711 differentially amplifies the input signal IN and the reference voltage VREF in synchronization with a rising edge of the first clock signal CK0. The first latch 712 latches the output of the first comparator 711 and outputs the latched signal as the first output signal OUT0. The second receiver 720 receives the second clock signal CK90, the input signal IN, and the reference voltage VREF and generates the second output signal OUT90 by differentially amplifying the input signal IN and the reference voltage VREF in synchronization with the second clock signal CK90. The second receiver 720 includes a second comparator 721 and a second latch 722. The second comparator 721 differentially amplifies the input signal IN and the reference voltage VREF in synchronization with a rising edge of the second clock signal CK90. The second latch 722 latches the output of the second comparator 721 and outputs the latched signal as the second output signal OUT90. The third receiver 730 receives the third clock signal CK180, the input signal IN, and the reference voltage VREF and generates the third output signal OUT180 by differentially amplifying the input signal IN and the reference voltage VREF in synchronization with the third clock signal CK180. The third receiver 730 includes a third comparator 731 and a third latch 732. The third comparator 731 differentially amplifies the input signal IN and the reference voltage VREF in synchronization with a rising edge of the third clock signal CK180. The third latch 732 latches the output of the third comparator 731 and outputs the latched signal as the third output signal OUT180. The fourth receiver 740 receives the fourth clock signal CK270, the input signal IN, and the reference voltage VREF and generates the fourth output signal OUT270 by differentially amplifying the input signal IN and the reference voltage VREF in synchronization with the fourth clock signal CK270. The fourth receiver 740 includes a fourth comparator 741 and a fourth latch 742. The fourth comparator 741 differentially amplifies the input signal IN and the reference voltage VREF in synchronization with a rising edge of the fourth clock signal CK270. The fourth latch 742 latches the output of the fourth comparator 741 and outputs the latched signal as the fourth output signal OUT270.

The first delay circuit 751 receives the first output signal OUT0 and voltage information signal VI. The first delay circuit 751 generates the first delay output signal OUTD0 by variably delaying the first output signal OUT0 based on the first output signal OUT0 and the voltage information signal VI. The first delay circuit 751 delays the first output signal OUT0 by a time period corresponding to a phase difference between the first clock signal CK0 and the second clock signal CK90. The first delay circuit 751 generates the first delay output signal OUTD0 by additionally variably delaying the first output signal OUT0 based on the first output signal OUT0 and the voltage information signal VI. The first delay circuit 751 increases the delay time period of the first output signal OUT0 as a difference between voltage level of the first output signal OUT0 and the voltage level of the reference voltage VREF increases. The first delay circuit 751 decreases the delay time period of the first output signal OUT0 as the difference between the voltage level of the first output signal OUT0 and the voltage level of the reference voltage VREF decreases. The voltage information signal VI includes the high voltage signal VH, the low voltage signal VL, and the middle voltage signal VM, and may be substantially the same signal as the voltage information signal VI described with respect to FIG. 1. The first delay circuit 751 has substantially the same structure and performs substantially the same function as the first delay circuit 130 illustrated in FIG. 4A. The second delay circuit 752 receives the second output signal OUT90 and the voltage information signal VI. The second delay circuit 752 generates the second delay output signal OUTD90 by variably delaying the second output signal OUT90 based on the second output signal OUT90 and the voltage information signal VI. The second delay circuit 752 increases the delay time period of the second output signal OUT90 as a difference between the voltage level of the second output signal OUT90 and the voltage level of the reference voltage VREF increases. The second delay circuit 752 decreases the delay time period of the second output signal OUT90 as the difference between the voltage level of the second output signal OUT90 and the voltage level of the reference voltage VREF decreases. The second delay circuit 752 may have substantially the same structure and perform substantially the same function as the second delay circuit 140 illustrated in FIG. 4B.

The third delay circuit 753 receives the third output signal OUT180 and the voltage information signal VI. The third delay circuit 753 generates the third delay output signal OUTD180 by variably delaying the third output signal OUT180 based on the third output signal OUT180 and the voltage information signal VI. The third delay circuit 753 delays the third output signal OUT180 by a time period corresponding to a phase difference between the third clock signal CK180 and the fourth clock signal CK270. The third delay circuit 753 generates the third delay output signal OUTD180 by additionally variably delaying the third output signal OUT180 based on the third output signal OUT180 and the voltage information signal VI. The third delay circuit 753 increases the delay time period of the third output signal OUT180 as a difference between the voltage level of the third output signal OUT180 and the voltage level of the reference voltage VREF increases. The third delay circuit 753 decreases the delay time period of the third output signal OUT180 as the difference between the voltage level of the third output signal OUT180 and the voltage level of the reference voltage VREF decreases. The third delay circuit 753 may have substantially the same structure and perform substantially the same function as the first delay circuit 130 illustrated in FIG. 4A. The fourth delay circuit 754 receives the fourth output signal OUT270 and the voltage information signal VI. The fourth delay circuit 754 generates the fourth delay output signal OUTD270 by variably delaying the fourth output signal OUT270 based on the fourth output signal OUT270 and the voltage information signal VI. The fourth delay circuit 754 increases the delay time period of the fourth output signal OUT270 as a difference between voltage level between the fourth output signal OUT270 and the voltage level of the reference voltage VREF increases. The fourth delay circuit 754 decreases the delay time period of the fourth output signal OUT270 as the difference between the voltage level the fourth output signal OUT270 and the voltage level of the reference voltage VREF decreases. The fourth delay circuit 754 may have substantially the same structure and perform substantially the same function as the second delay circuit 140 illustrated in FIG. 4B.

The first alignment circuit 761 receives the first alignment clock signal CKA90, the first delay output signal OUTD0, and the second delay output signal OUTD90. The first alignment circuit 761 generates the first alignment output signal OUTA0 and a second alignment output signal OUTA90 from the first delay output signals OUTD0 and the second delay output signal OUTD90 based on the first alignment clock signal CKA90. In synchronization with the first alignment clock signal CKA90, the first alignment circuit 761 outputs the first delay output signal OUTD0 as the first alignment output signal OUTA0 and outputs the second delay output signal OUTD90 as the second alignment output signal OUTA90. The second alignment circuit 762 receives the second alignment clock signal CKA270, the third delay output signal OUTD180, and the fourth delay output signal OUTD270. The second alignment circuit 762 generates the third alignment output signal OUTA180 and the fourth alignment output signal OUTA270 from the third delay output signal OUTD180 and fourth delay output signal OUTD270 based on the second alignment clock signal CKA270. In synchronization with the second alignment clock signal CKA270, the second alignment circuit 762 outputs the third delay output signal OUTD180 as the third alignment output signal OUTA180 and outputs the fourth delay output signal OUTD270 as the fourth alignment output signal OUTA270.

Figure 12:
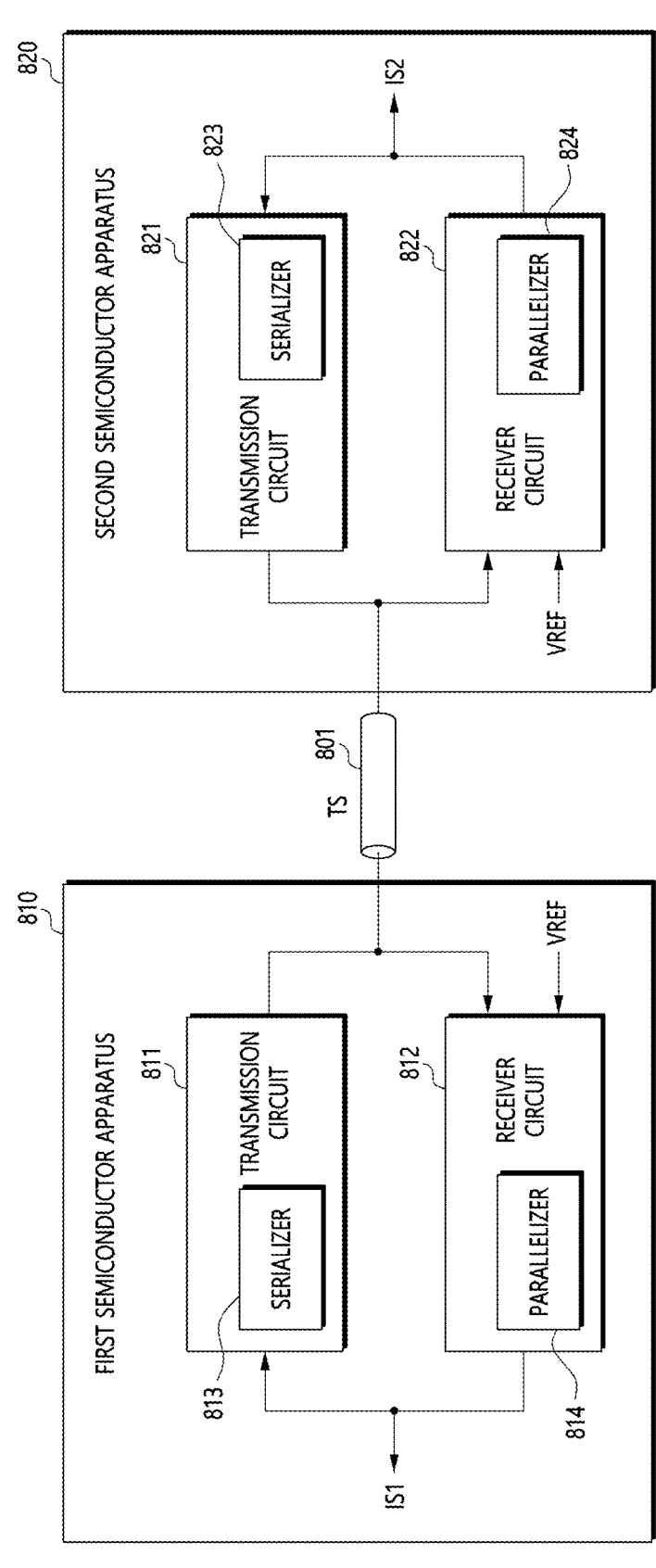
FIG. 12 is a diagram illustrating a configuration of a semiconductor system in accordance with an embodiment.

FIG. 12 is a diagram illustrating the configuration of a semiconductor system 800 in accordance with an embodiment. Referring to FIG. 12, the semiconductor system 800 includes a first semiconductor apparatus 810 and a second semiconductor apparatus 820. The first semiconductor apparatus 810 may be a master device that provides various control signals that facilitate operation of the second semiconductor apparatus 820. The first semiconductor apparatus 810 may include one or more various different types of host devices. For example, the first semiconductor apparatus 810 may include at least one of a central processing unit (CPU), a graphics processing unit (GPU), a multimedia processor (MMP), and a digital signal processor, an application processor (AP), and a memory controller. The second semiconductor apparatus 820 may be a slave device capable of performing various operations according to the control signals provided by the first semiconductor apparatus 810. For example, the second semiconductor apparatus 820 may be a memory device, and the memory device may include a volatile memory and/or a nonvolatile memory. The volatile memory may include a static RAM (SRAM), a dynamic RAM (DRAM), and a synchronous DRAM (SDRAM), and the nonvolatile memory may include a read only memory (ROM), a programmable ROM (PROM), an electrically erasable and programmable ROM (EEPROM), an erasable and programmable ROM (EPROM), a flash memory, a phase change RAM (PRAM), a magnetic RAM (MRAM), a resistive RAM (RRAM), a ferroelectric RAM (FRAM), and the like.

The first semiconductor apparatus 810 is connected to the second semiconductor apparatus 820 through a signal transmission line 801. The signal transmission line 801 transmits a transmission signal TS from the first semiconductor apparatus 810 to the second semiconductor apparatus 820 and transmits a transmission signal TS from the second semiconductor apparatus 820 to the first semiconductor apparatus 810. The transmission signal TS includes a plurality of signals exchanged in either direction between the first semiconductor apparatus 810 and the second semiconductor apparatus 820. The transmission signal TS may be a serial signal, and the signal transmission line 801 may be a serial bus over which the serial signal is transmitted. The first semiconductor apparatus 810 generates the transmission signal TS based on a first internal signal IS1 and generates the first internal signal IS1 based on the transmission signal TS transmitted from the second semiconductor apparatus 820. The first internal signal IS1 may be a parallel signal. The first semiconductor apparatus 810 generates the transmission signal TS by serializing the first internal signal IS1 and generates the first internal signal IS1 by parallelizing the transmission signal TS. The second semiconductor apparatus 820 generates the transmission signal TS based on a second internal signal IS2 and generates the second internal signal IS2 based on the transmission signal TS transmitted from the first semiconductor apparatus 810. The second internal signal IS2 may be a parallel signal. The second semiconductor apparatus 820 generates the transmission signal TS by serializing the second internal signal IS2 and generates the second internal signal IS2 by parallelizing the transmission signal TS. In an embodiment, the signal transmission line 801 may be a data bus, and the transmission signal TS may be a serial data stream. The first internal signal IS1 may be a parallel data signal within the first semiconductor apparatus 810, and the second internal signal IS2 may be a parallel data signal within the second semiconductor apparatus 820.

The first semiconductor apparatus 810 includes a transmission circuit 811 and a receiver circuit 812. The transmission circuit 811 receives the first internal signal IS1 and converts the first internal signal IS1 into a serial signal. The transmission circuit 811 use a half-rate clock signal or a quarter-rate clock signal to serialize the first internal signal IS1. The transmission circuit 811 includes a serializer 813 that generates the serial signal by serializing the first internal signal IS1. The transmission circuit 811 is connected to the signal transmission line 801. The transmission circuit 811 generates the transmission signal TS based on the serial signal. The transmission circuit 811 transmits the transmission signal TS to the second semiconductor apparatus 820 through the signal transmission line 801. The receiver circuit 812 is connected to the signal transmission line 801 and receives the transmission signal TS transmitted from the second semiconductor apparatus 820 through the signal transmission line 801. The receiver circuit 812 uses a reference voltage VREF to receive the transmission signal TS. The receiver circuit 812 generates a plurality of output signals by differentially amplifying the transmission signal TS and the reference voltage VREF. The receiver circuit 812 receives half-rate or quarter-rate clock signals and generates the plurality of output signals by differentially amplifying the transmission signal TS and the reference voltage VREF in synchronization with the clock signals. The receiver circuit 812 generates a plurality of delay output signals by delaying the plurality of output signals based on a difference between a voltage level of each of the plurality of output signals and the voltage level of the reference voltage VREF. The receiver circuit 812 converts the plurality of delay output signals into parallel signals. The receiver circuit 812 receives at least one alignment clock signal to parallelize the plurality of delay output signals. The receiver circuit 812 includes a parallelizer 814 that generates the parallel signal by parallelizing the plurality of delay output signals. The receiver circuit 812 outputs the parallel signal as the first internal signal IS1. The receiver circuit 812 may be implemented similarly to one of the receiver circuit 100 described with respect to FIG. 1 and the receiver circuit 700 described with respect to FIG. 11. The parallelizer 814 may be implemented similarly to the alignment circuit 150 described with respect to FIG. 1 or the alignment circuits 761 and 762 described with respect to FIG. 11.

The second semiconductor apparatus 820 includes a transmission circuit 821 and a receiver circuit 822. The transmission circuit 821 receives the second internal signal IS2 and converts the second internal signal IS2 into a serial signal. The transmission circuit 821 uses a half-rate clock signal or a quarter-rate clock signal to serialize the second internal signal IS2. The transmission circuit 821 includes a serializer 823 that generates the serial signal by serializing the second internal signal IS2. The transmission circuit 821 is connected to the signal transmission line 801. The transmission circuit 821 generates the transmission signal TS based on the serial signal. The transmission circuit 821 transmits the transmission signal TS to the first semiconductor apparatus 810 through the signal transmission line 801. The receiver circuit 822 is connected to the signal transmission line 801 and receives the transmission signal TS transmitted from the first semiconductor apparatus 810 through the signal transmission line 801. The receiver circuit 822 uses the reference voltage VREF to receive the transmission signal TS. The receiver circuit 822 generates a plurality of output signals by differentially amplifying the transmission signal TS and the reference voltage VREF. The receiver circuit 822 receives half-rate or quarter-rate clock signals and generates the plurality of output signals by differentially amplifying the transmission signal TS and the reference voltage VREF in synchronization with the clock signals. The receiver circuit 822 generates a plurality of delay output signals by delaying the plurality of output signals, based on the difference between the voltage level of each of the plurality of output signals and the voltage level of the reference voltage VREF. The receiver circuit 822 converts the plurality of delay output signals into parallel signals. The receiver circuit 822 receives at least one alignment clock signal to parallelize the plurality of delay output signals. The receiver circuit 822 includes a parallelizer 824 that generates the parallel signal by parallelizing the plurality of delay output signals. The receiver circuit 822 outputs the parallel signal as the second internal signal IS2. The receiver circuit 822 may be implemented similarly to one of the receiver circuit 100 described with respect to FIG. 1 and the receiver circuit 700 described with respect to FIG. 11. The parallelizer 824 may be implemented similarly to the alignment circuit 150 described with respect to FIG. 1 or the alignment circuits 761 and 762 described with respect to FIG. 11.

A person skilled in the art to which the present disclosure pertains understands that various modifications, additions, and substitutions are possible without departing from the scope and technical concepts of the present disclosure. The embodiments described above are illustrative, not restrictive. All changes within the meaning and range of equivalency of the claims are included within their scope.

What is claimed is:

1. A receiver circuit comprising:
a first receiver configured to generate, based on a clock signal, a first output signal by differentially amplifying an input signal and a reference voltage;
a second receiver configured to generate, based on a complementary clock signal, a second output signal by differentially amplifying the input signal and the reference voltage;
a first delay circuit configured to generate a first delay output signal by variably delaying the first output signal based on a voltage information signal and the first output signal; and
a second delay circuit configured to generate a second delay output signal by variably delaying the second output signal based on the voltage information signal and the second output signal.

2. The receiver circuit according to claim 1, wherein the first receiver comprises:
a first comparator configured to differentially amplify, in synchronization with the clock signal, the input signal and the reference voltage; and
a first latch configured to generate the first output signal by latching an output of the first comparator.

3. The receiver circuit according to claim 1, wherein the second receiver comprises:
a second comparator configured to differentially amplify, in synchronization with the complementary clock signal, the input signal and the reference voltage; and
a second latch configured to generate the second output signal by latching an output of the second comparator.

4. The receiver circuit according to claim 1, wherein the first delay circuit comprises:
a fixed delay circuit configured to delay the first output signal by a time period corresponding to a phase difference between the clock signal and the complementary clock signal;
a first variable delay circuit configured to generate the first delay output signal by variably delaying an output of the fixed delay circuit based on a first delay control signal; and a first delay control circuit configured to generate the first delay control signal based on the voltage information signal and the first output signal.

5. The receiver circuit according to claim 4, wherein the voltage information signal includes a high voltage signal and a low voltage signal;
wherein the first delay control signal includes a first control signal and a second control signal; and
wherein the first delay control circuit is configured to generate the first control signal according to a logic level of the high voltage signal and a logic level of the first output signal and to generate the second control signal according to a logic level of the low voltage signal and a logic level of the first output signal.

6. The receiver circuit according to claim 4, wherein the voltage information signal includes a high voltage signal, a middle voltage signal, and a low voltage signal;
wherein the first delay control signal includes a first control signal and a second control signal; and
wherein the first delay control circuit is configured to generate the first control signal according to a logic level of the high voltage signal, a logic level of the low voltage signal, and a logic level of the first output signal and to generate the second control signal from the middle voltage signal.

7. The receiver circuit according to claim 4, wherein the first delay control signal includes a first control signal and a second control signal; and
wherein the first variable delay circuit comprises:
a first buffer configured to buffer the first output signal and output the buffered signal at a delay node;
a first switch configured to selectively connect a first capacitor to the delay node based on the first control signal;
a second switch configured to selectively connect a second capacitor to the delay node based on the second control signal; and
a second buffer configured to generate the first delay output signal by buffering a signal at the delay node.

8. The receiver circuit according to claim 4, wherein the second delay circuit comprises:
a second variable delay circuit configured to generate the second delay output signal by variably delaying the second output signal based on a second delay control signal; and
a second delay control circuit configured to generate the second delay control signal based on the voltage information signal and the second output signal.

9. The receiver circuit according to claim 1, further comprising an alignment circuit configured to generate, in synchronization with an alignment clock signal, a first alignment output signal and a second alignment output signal from the first delay output signal and the second delay output signal, respectively.

10. The receiver circuit according to claim 1, wherein the voltage information signal includes a high voltage signal and a low voltage signal; and
wherein the receiver circuit further comprises:
a voltage information generation circuit configured to generate, based on a voltage level of the reference voltage, the high voltage signal and the low voltage signal;
wherein the voltage information generation circuit is configured to assert the high voltage signal when the voltage level of the reference voltage is between a high voltage level and a middle voltage level and to assert the low voltage signal when the voltage level of the reference voltage is between the middle voltage level and a low voltage level.

11. The receiver circuit according to claim 1, wherein the voltage information signal includes a high voltage signal, a middle voltage signal, and a low voltage signal;

wherein the receiver circuit further comprises:
a voltage information generation circuit configured to generate, based on a voltage level of the reference voltage, the high voltage signal, the middle voltage signal, and the low voltage signal;

wherein the voltage information generation circuit is configured to assert the high voltage signal when the voltage level of the reference voltage is between a high voltage level and a first threshold voltage level, to assert the middle voltage signal when the voltage level of the reference voltage is between the first threshold voltage level and a second threshold voltage level, and to assert the low voltage signal when the voltage level of the reference voltage is between the second threshold voltage level and a low voltage level.

12. A receiver circuit comprising:
a first receiver configured to generate, based on a clock signal, a first output signal by differentially amplifying an input signal and a reference voltage;

a second receiver configured to generate, based on a complementary clock signal, a second output signal by differentially amplifying the input signal and the reference voltage;

a first delay circuit configured to generate a first delay output signal by variably delaying the first output signal based on a difference between a voltage level of the first output signal and a voltage level of the reference voltage; and a second delay circuit configured to generate a second delay output signal by variably delaying the second output signal based on a difference between a voltage level of the second output signal and the voltage level of the reference voltage.

13. The receiver circuit according to claim 12, wherein the first delay circuit is configured to decrease a delay time period of the first output signal as the difference between the voltage level of the first output signal and the voltage level of the reference voltage decreases and to increase the delay time period of the first output signal as the difference between the voltage level of the first output signal and the voltage level of the reference voltage increases.

14. The receiver circuit according to claim 12, wherein the first delay circuit comprises:
a fixed delay circuit configured to delay the first output signal by a time period corresponding to a phase difference between the clock signal and the complementary clock signal;

a first variable delay circuit configured to variably delay an output of the fixed delay circuit based on a first delay control signal; and a first delay control circuit configured to generate the first delay control signal based on the difference between the voltage level of the first output signal and the voltage level of the reference voltage.

15. The receiver circuit according to claim 12, wherein the second delay circuit is configured to decrease a delay time period of the second output signal as the difference between the voltage level of the second output signal and the voltage level of the reference voltage decreases, and to increase the delay time period of the second output signal as the difference between the voltage level of the second output signal and the voltage level of the reference voltage increases.

16. The receiver circuit according to claim 12, wherein the second delay circuit comprises:
a second variable delay circuit configured to variably delay the second output signal based on a second delay control signal; and a second delay control circuit configured to generate the second delay control signal based on the difference between the voltage level of the second output signal and the voltage level of the reference voltage.

17. The receiver circuit according to claim 12, further comprising an alignment circuit configured to generate, in synchronization with an alignment clock signal, a first alignment output signal from the first delay output signal and a second alignment output signal from the second delay output signals.

18. A receiver circuit comprising:
a first receiver configured to generate, in synchronization with a first clock signal, a first output signal by differentially amplifying an input signal and a reference voltage;

a second receiver configured to generate, in synchronization with a second clock signal, a second output signal by differentially amplifying the input signal and the reference voltage;

a third receiver configured to generate, in synchronization with a third clock signal, a third output signal by differentially amplifying the input signal and the reference voltage;

a fourth receiver configured to generate, in synchronization with a fourth clock signal, a fourth output signal by differentially amplifying the input signal and the reference voltage;

a first delay circuit configured to generate a first delay output signal by variably delaying the first output signal based on a difference between a voltage level of the first output signal and a voltage level of the reference voltage;

a second delay circuit configured to generate a second delay output signal by variably delaying the second output signal based on a difference between a voltage level of the second output signal and the voltage level of the reference voltage;

a third delay circuit configured to generate a third delay output signal by variably delaying the third output signal based on a difference between a voltage level of the third output signal and the voltage level of the reference voltage; and a fourth delay circuit configured to generate a fourth delay output signal by variably delaying the fourth output signal based on a difference between a voltage level of the fourth output signal and the voltage level of the reference voltage.

19. The receiver circuit according to claim 18, wherein a phase difference between the first clock signal and the second clock signal is 90°, a phase difference between the second clock signal and the third clock signal is 90°, a phase difference between the third clock signal and the fourth clock signal is 90°, and a phase difference between the fourth clock signal and the first clock signal is 90°; and wherein a phase difference between a first alignment clock signal and a second alignment clock signal is 180°.

20. The receiver circuit according to claim 18, wherein the first delay circuit is configured to generate a first fixed delay signal by delaying the first output signal by a time period corresponding to a phase difference between the first clock signal and the second clock signal, and to generate the first delay output signal by variably delaying the first fixed delay signal based on the difference between the voltage level of the first output signal and the voltage level of the reference voltage.

21. The receiver circuit according to claim 20, wherein the second delay circuit is configured to generate the second delay output signal by variably delaying the second output signal based on the difference between the voltage level of the second output signal and the voltage level of the reference voltage.

22. The receiver circuit according to claim 18, wherein the third delay circuit is configured to generate a second fixed delay signal by delaying the third output signal by a time period corresponding to a phase difference between the third clock signal and the fourth clock signal and to generate the third delay output signal by variably delaying the second fixed delay signal based on the difference between the voltage level of the third output signal and the voltage level of the reference voltage.

23. The receiver circuit according to claim 22, wherein the fourth delay circuit is configured to generate the fourth delay output signal by variably delaying the fourth output signal based on the difference between the voltage level of the fourth output signal and the voltage level of the reference voltage.

24. The receiver circuit according to claim 18, further comprising:

a first alignment circuit configured to generate, in synchronization with a first alignment clock signal, a first alignment output signal from the first delay output signal and a second alignment output signal from the second delay output signal; and a second alignment circuit configured to generate, in synchronization with a second alignment clock signal, a third alignment output signal from the third delay output signal and a fourth alignment output signal from the fourth delay output signal.

* * * * *